(12) United States Patent
Kim et al.

(10) Patent No.: US 12,039,117 B2
(45) Date of Patent: *Jul. 16, 2024

(54) DISPLAY DEVICE

(71) Applicant: Samsung Display Co., Ltd., Yongin-si (KR)

(72) Inventors: Ji-Hyun Kim, Hwaseong-si (KR); Woongsik Kim, Hwaseong-si (KR); Jin-Su Byun, Seoul (KR); Tae Wook Kang, Seongnam-si (KR); Gwangmin Cha, Hwaseong-si (KR); Saehee Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/134,051

(22) Filed: Apr. 13, 2023

(65) Prior Publication Data

US 2023/0251731 A1 Aug. 10, 2023

Related U.S. Application Data

(63) Continuation of application No. 17/095,633, filed on Nov. 11, 2020, now Pat. No. 11,650,681.

(30) Foreign Application Priority Data

Feb. 20, 2020 (KR) .................. 10-2020-0021039

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *H10K 50/844* (2023.02);
(Continued)

(58) Field of Classification Search
CPC ....... G02F 1/13338; G06F 2203/04111; G06F 2203/04112; G06F 3/0412; G06F 3/0443;
(Continued)

(56) References Cited

U.S. PATENT DOCUMENTS 9,046,952 B2 6/2015 Kim et al.
10,068,957 B2 9/2018 Kim et al.
(Continued)

FOREIGN PATENT DOCUMENTS

EP 3 109 742 12/2016
EP 3 276 470 1/2018
(Continued)

OTHER PUBLICATIONS

Notice of Allowance dated Jan. 13, 2023, in U.S. Appl. No. 17/095,633.

*Primary Examiner* — Insa Sadio
(74) *Attorney, Agent, or Firm* — Lewis Roca Rothgerber Christie LLP

(57) ABSTRACT

Provided is a display device that includes a display panel including a plurality of light emitting areas and a non-light emitting area between the light emitting areas, an insulating layer disposed on the display panel, a first conductive pattern overlapping the non-light emitting area and directly disposed on the insulating layer, a color filter layer overlapping the light emitting areas and disposed on the insulating layer, a first insulating layer disposed on the first conductive pattern and the color filter layer and in which opening parts overlapping the light emitting areas are defined, and a second conductive pattern overlapping the non-light emitting area and disposed on the first insulating layer.

16 Claims, 18 Drawing Sheets

(51) Int. Cl.
*H10K 50/844* (2023.01)
*H10K 50/86* (2023.01)
*H10K 59/12* (2023.01)
*H10K 59/38* (2023.01)
*H10K 59/40* (2023.01)

(52) U.S. Cl.
CPC .......... *H10K 50/865* (2023.02); *H10K 59/12* (2023.02); *H10K 59/38* (2023.02); *H10K 59/40* (2023.02); *G06F 3/0443* (2019.05); *G06F 2203/04111* (2013.01); *G06F 2203/04112* (2013.01)

(58) Field of Classification Search
CPC ... G06F 3/0446; H01L 27/322; H01L 27/323; H01L 27/3244; H01L 51/524; H01L 51/5253; H01L 51/5271; H01L 51/5284
See application file for complete search history.

(56) References Cited

U.S. PATENT DOCUMENTS

| | | | |
|---|---|---|---|
| 10,347,700 B2 | 7/2019 | Yang et al. | |
| 10,644,083 B2 | 5/2020 | Lee et al. | |
| 10,877,584 B2 | 12/2020 | Lee et al. | |
| 2007/0029548 A1* | 2/2007 | Yamazaki | H10K 71/12 257/40 |
| 2016/0378224 A1 | 12/2016 | Kwon et al. | |
| 2018/0032188 A1 | 2/2018 | Park et al. | |
| 2018/0095567 A1* | 4/2018 | Lee | G06F 3/0446 |
| 2018/0292750 A1 | 10/2018 | Lee et al. | |
| 2018/0350883 A1 | 12/2018 | Lee et al. | |
| 2019/0050104 A1 | 2/2019 | Na et al. | |
| 2019/0129541 A1 | 5/2019 | Kwon et al. | |
| 2019/0146611 A1 | 5/2019 | Park et al. | |
| 2019/0165061 A1 | 5/2019 | Jung et al. | |
| 2019/0341428 A1 | 11/2019 | Lee et al. | |
| 2020/0401251 A1 | 12/2020 | Kwon et al. | |
| 2021/0005845 A1 | 1/2021 | Kim et al. | |

FOREIGN PATENT DOCUMENTS

| | | |
|---|---|---|
| EP | 3301553 | 4/2018 |
| EP | 3 761 368 | 1/2021 |
| KR | 10-2016-0063462 | 6/2016 |
| KR | 10-2017-0055584 | 5/2017 |
| KR | 10-2017-0109184 | 9/2017 |
| KR | 10-2017-0113822 | 10/2017 |
| KR | 10-2018-0114580 | 10/2018 |
| KR | 10-2018-0133024 | 12/2018 |
| KR | 10-2019-0016635 | 2/2019 |
| KR | 10-1992915 | 6/2019 |

* cited by examiner

DISPLAY DEVICE

CROSS-REFERENCE TO RELATED APPLICATIONS

This application is a Continuation of U.S. application Ser. No. 17/095,633, filed on Nov. 11, 2020, which claims priority from and the benefit of Korean Patent Application No. 10-2020-0021039, filed on Feb. 20, 2020, the entire contents of which are hereby incorporated by reference.

BACKGROUND

Field

The inventive concepts herein relate to a display device.

Discussion of the Background

Electronic devices such as smart phones, digital cameras, notebook computers, navigation devices, and smart televisions that provide images to a user include display devices configured to display images. The display device includes a display panel configured to generate an image and an input device such as an input detection part.

The input detection part is disposed on the display panel and detects a user's touch. The signal detected by the input detection part is converted into an input signal. The display panel provides the user with an image corresponding to the input signal of the input detection part.

The display device is disposed on the display panel and includes a polarizing film that prevents reflection of external light. The polarizing film is defined as an external light antireflection film. The polarizing film reduces the reflectance of external light incident from the display device toward the display panel. Illustratively, the polarizing film POL may include a phase retarder and/or a polarizer. However, because the thickness of the polarizing film is thick, when the polarizing film is used, the thickness of the display device may be increased.

The above information disclosed in this Background section is only for understanding of the background of the inventive concepts, and, therefore, it may contain information that does not constitute prior art.

SUMMARY

The present disclosure provides a display device capable of reducing thickness.

Additional features of the inventive concepts will be set forth in the description which follows, and in part will be apparent from the description, or may be learned by practice of the inventive concepts.

An embodiment of the inventive concept provides a display device including: a display panel including a plurality of light emitting areas and a non-light emitting area between the light emitting areas; an insulating layer disposed on the display panel; a first conductive pattern overlapping the non-light emitting area and directly disposed on the insulating layer; a color filter layer overlapping the light emitting areas and disposed on the insulating layer; a first insulating layer disposed on the first conductive pattern and the color filter layer and in which opening parts overlapping the light emitting areas are defined; and a second conductive pattern overlapping the non-light emitting area and disposed on the first insulating layer.

In an embodiment of the inventive concept, a display device includes: a display panel including a plurality of light emitting areas and a non-light emitting area between the light emitting areas; an insulating layer disposed on the display panel; a color filter layer overlapping the light emitting areas and extending to a portion of the non-light emitting area adjacent to each of the light emitting areas to be disposed directly on the insulating layer; a first insulating layer disposed on the color filter layer and in which opening parts overlapping the light emitting areas are defined; a black matrix overlapping the non-light emitting area and disposed on the first insulating layer; and a second insulating layer disposed on the color filter layer, the first insulating layer, and the black matrix and configured to fill the opening parts, wherein side surfaces of the first insulating layer where the opening parts are defined have an inclining surface.

In an embodiment of the inventive concept, a display device includes: a display panel including a plurality of light emitting areas and a non-light emitting area between the light emitting areas; an insulating layer disposed on the display panel; a first conductive pattern overlapping the non-light emitting area and directly disposed on the insulating layer; a color filter layer overlapping the light emitting areas and extending to a portion of the non-light emitting area adjacent to each of the light emitting areas to be disposed on the insulating layer; a black matrix overlapping the non-light emitting area and disposed on the insulating layer to cover the first conductive pattern; a first insulating layer disposed on the color filter layer and the black matrix and in which opening parts overlapping the light emitting areas are defined; and a second insulating layer disposed on the color filter layer and the first insulating layer and configured to fill the opening parts, wherein side surfaces of the first insulating layer where the opening parts are defined have an inclining surface.

It is to be understood that both the foregoing general description and the following detailed description are exemplary and explanatory and are intended to provide further explanation of the invention as claimed.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
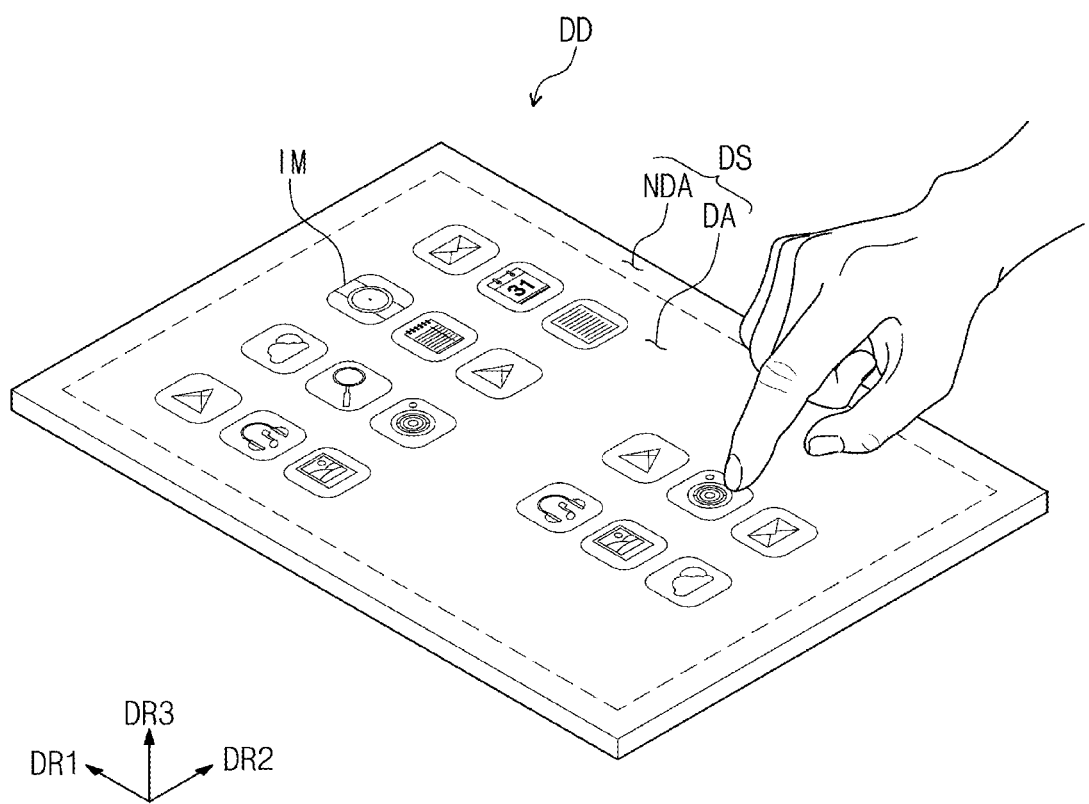
FIG. 1 is a perspective view illustrating a display device according to an embodiment of the inventive concept.

I The accompanying drawings, which are included to provide a further understanding of the invention and are incorporated in and constitute a part of this specification, illustrate exemplary embodiments of the invention, and together with the description serve to explain the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations illustrated in the drawing. The terms are described as a relative concept based on a direction illustrated in the drawing.

Unless otherwise defined, all terms (including technical and scientific terms) used herein have the same meaning as terms commonly understood by those skilled in the art to which this invention belongs. In general, the terms defined in the dictionary should be considered to have the same meaning as the contextual meaning of the related art, and, unless clearly defined herein, should not be understood abnormally or as having an excessively formal meaning.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept are described in more detail with reference to the accompanying drawings.

FIG. 1 is a perspective view illustrating a display device according to an embodiment of the inventive concept.

Referring to FIG. 1, a display device DD according to an embodiment of the inventive concept may have a rectangular shape with long sides extending in the first direction DR1 and short sides extending in the second direction DR2 intersecting the first direction DR1. However, the inventive concept is not limited thereto, and the display device DD may have various shapes such as a circle or a polygon.

Hereinafter, the direction substantially perpendicular to the plane defined by the first direction DR1 and the second direction DR2 is defined as the third direction DR3.

The upper surface of the display device DD may be defined as the display surface DS and may have a plane defined by the first direction DR1 and the second direction DR2. The images IM generated by the display device DD may be provided to the user through the display surface DS.

The display surface DS may include a display area DA and a non-display area NDA around the display area DA. The display area DA may display an image, and the non-display area NDA may not display an image. The non-display area NDA may surround the display area DA and may define an outline portion of the display device DD printed in a predetermined color.

The display device DD may be used for large electronic devices such as televisions, monitors, or external billboards. In addition, the display device DD may be used in small and medium-sized electronic devices such as personal computers, notebook computers, personal digital terminals, car navigation systems, game machines, smartphones, tablets, or cameras. However, these are presented as exemplary embodiments only and may be used for other electronic devices without departing from the concept of the inventive concept.

Figure 2:
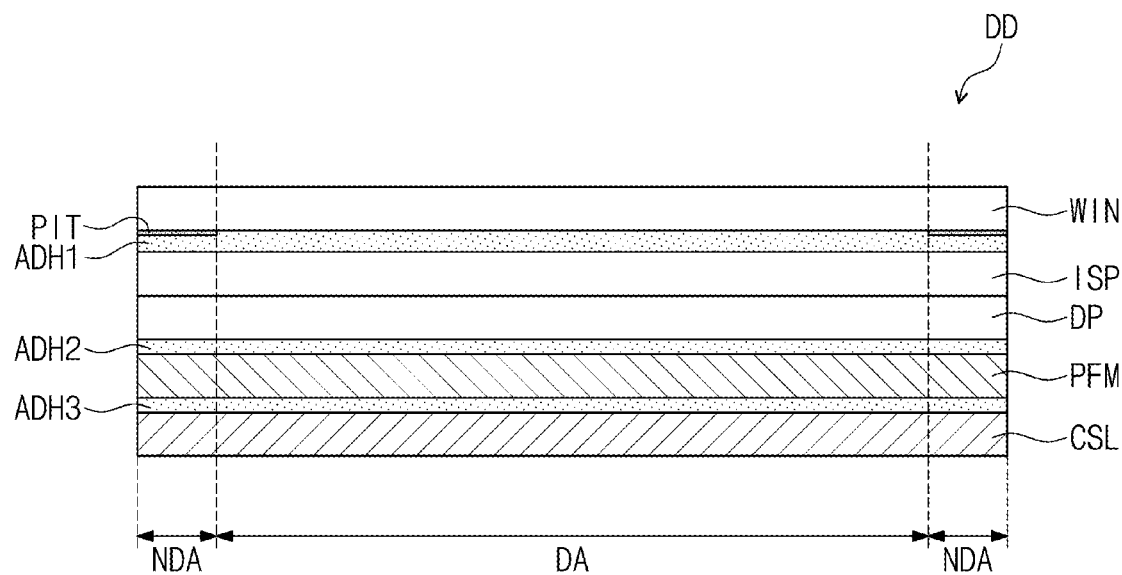
FIG. 2 is a diagram illustratively illustrating a cross-section of the display device illustrated in FIG. 1.

FIG. 2 is a diagram illustrating a cross-section of the display device illustrated in FIG. 1.

Referring to FIG. 2, a display device DD may include a display panel DP, an input detection part ISP, a window WIN, a print layer PIT, a protective film PFM, a cushion layer CSL, and first to third adhesives ADH1, ADH2, and ADH3.

The display panel DP may include a display area DA and a non-display area NDA around the display area DA. The display panel DP may be a flexible display panel. For example, the display panel DP may include a plurality of electronic elements disposed on the flexible substrate.

The display panel DP according to an embodiment of the inventive concept may be a light emitting display panel, and is not particularly limited. For example, the display panel DP may be an organic light emitting display panel or a quantum dot light emitting display panel. The light emitting layer of the organic light emitting display panel may include an organic light emitting material. The light emitting layer of the quantum dot light emitting display panel may include quantum dot, quantum rod, and the like. Hereinafter, the display panel DP is described as an organic light emitting display panel.

The input detection part ISP may be disposed on the display panel DP. The input detection part ISP may include a plurality of detection parts (not illustrated) configured to detect an external input. The detection parts may detect an external input in a capacitive manner. The input detection part ISP may be manufactured directly on the display panel DP when manufacturing the display panel DP. However, the inventive concept is not limited thereto, and the input detection part ISP may be manufactured as a panel separated from the display panel DP and then, attached to the display panel DP by an adhesive.

The window WIN may be disposed on the input detection part ISP. The window WIN may protect the display panel DP and the input detection part ISP from external scratches and impacts. The image generated by the display panel DP may be provided to the user through the window WIN.

The protective film PFM may be disposed under the display panel DP. The protective film PFM may be defined as a protective substrate. The protective film PFM can protect the lower part of the display panel DP. The protective film PFM may include a flexible plastic material. For example, the protective film PFM may include polyethylene terephthalate (PET).

The cushion layer CSL may be disposed under the protective film PFM. The cushion layer CSL can protect the display panel DP by absorbing external impact applied to the lower part of the display panel DP. The cushion layer CSL may include a foam sheet having a predetermined elastic force.

The print layer PIT may overlap the non-display area NDA and may be disposed on the lower surface of the window WIN facing the display panel DP. The print layer PIT may have a predetermined color, and illustratively may be black. The non-display area NDA may be printed in a predetermined color by the print layer PIT.

The first adhesive ADH1 may be disposed between the window WIN and the input detection part ISP. The window WIN and the input detection part ISP may be bonded to each other by the first adhesive ADH1. The second adhesive ADH2 may be disposed between the display panel DP and the protective film PFM. The display panel DP and the protective film PFM may be bonded to each other by the second adhesive ADH2. The third adhesive ADH3 may be disposed between the protective film PFM and the cushion layer CSL. The protective film PFM and the cushion layer CSL may be bonded to each other by the third adhesive ADH3.

The first adhesive ADH1 may include an optical clear adhesive. Each of the second and third adhesives ADH2 and ADH3 may include a pressure sensitive adhesive.

Figure 3:
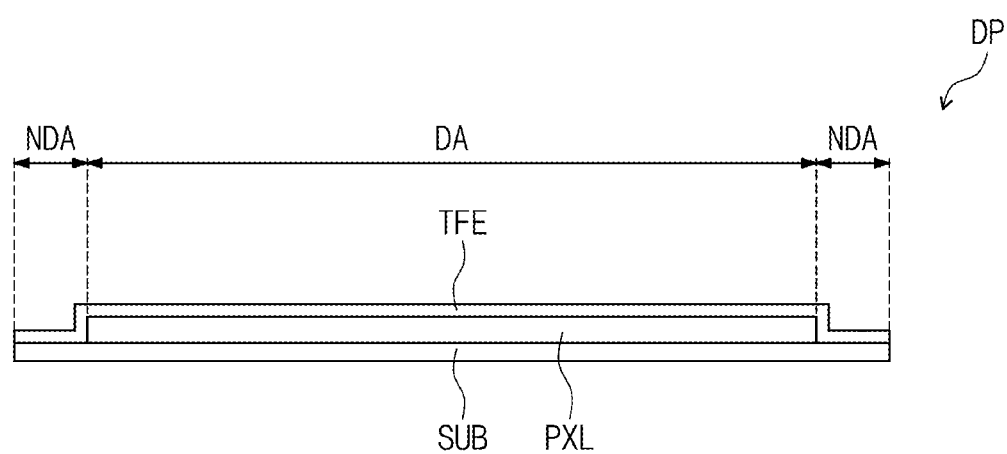
FIG. 3 is a diagram illustrating a cross-section of the display panel illustrated in FIG. 2 by way of example.

FIG. 3 is a diagram illustrating a cross-section of the display panel illustrated in FIG. 2 by way of example.

Referring to FIG. 3, a display panel DP may include a substrate SUB, a pixel layer PXL disposed on the substrate SUB, and a thin film encapsulation layer TFE disposed on the substrate SUB to cover the pixel layer PXL.

The substrate SUB may include a display area DA and a non-display area NDA around the display area DA. The substrate SUB may include a flexible plastic material. For example, the substrate SUB may include polyimide (PI). The pixel layer PXL may include a plurality of pixels. The configuration of the pixels will be described in detail below.

The thin film encapsulation layer TFE may include at least two inorganic layers and an organic layer disposed between the inorganic layers.

Figure 4:
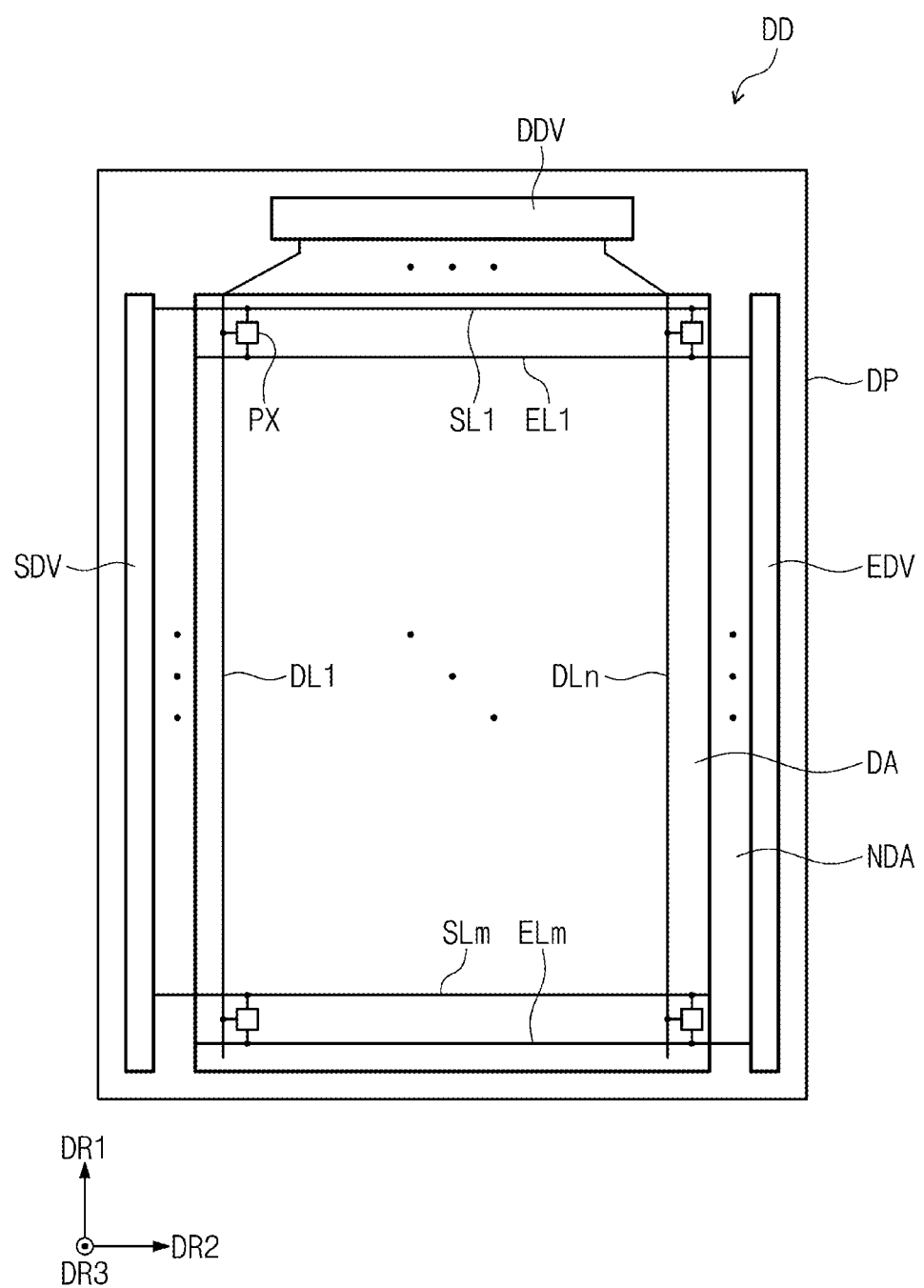
FIG. 4 is a plan view of the display panel illustrated in FIG. 2.

FIG. 4 is a plan view of the display panel illustrated in FIG. 2.

Referring to FIG. 4, a display device DD according to an embodiment of the inventive concept may include a display panel DP, a scan driver SDV, a data driver DDV, and an emission driver EDV. The scan driver SDV, the data driver DDV, and the emission driver EDV may be disposed in the non-display area NDA.

The display panel DP may have a rectangular shape having long sides in a first direction DR1 and short sides in a second direction DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, and a plurality of light emitting lines EL1 to ELm, m and n being natural numbers. The pixels PX may be arranged in a matrix form, but are not limited thereto and may be arranged in various forms. The pixels PX may be disposed in the display area DA and may be connected to the scan lines SL1 to SLm, the data lines DL1 to DLn, and the emission lines EL1 to ELm.

The scan driver SDV, the data driver DDV, and the emission driver EDV may be disposed in the non-display area NDA. The scan driver SDV and the emission driver EDV may be disposed adjacent to the long sides of the display panel DP, respectively. The data driver DDV may be manufactured in the form of an integrated circuit chip and disposed adjacent to any one of the short sides of the display panel DP.

The scan lines SL1 to SLm may extend in the second direction DR2 and may be connected to the scan driver SDV. The data lines DL1 to DLn may extend in the first direction DR1 and may be connected to the data driver DDV. The emission lines EL1 to ELm may extend in the second direction DR2 and may be connected to the emission driver EDV.

The scan driver SDV generates a plurality of scan signals, and the scan signals may be applied to the pixels PX through the scan lines SL1 to SLm. The scan signals may be sequentially applied to the pixels PX. The data driver DDV generates a plurality of data voltages, and the data voltages may be applied to the pixels PX through the data lines DL1 to DLn. The emission driver EDV generates a plurality of emission signals, and the emission signals may be applied to the pixels PX through the emission lines EL1 to ELm.

Although not illustrated in the drawing, the display device DD may further include a timing controller (not illustrated) configured to control operations of the scan driver SDV, the data driver DDV, and the emission driver EDV.

The pixels PX may be provided with the data voltages in response to the scan signals. The pixels PX may display an image by emitting light having luminance corresponding to data voltages in response to emission signals. The emission time of the pixels PX may be controlled by emission signals.

Figure 5:
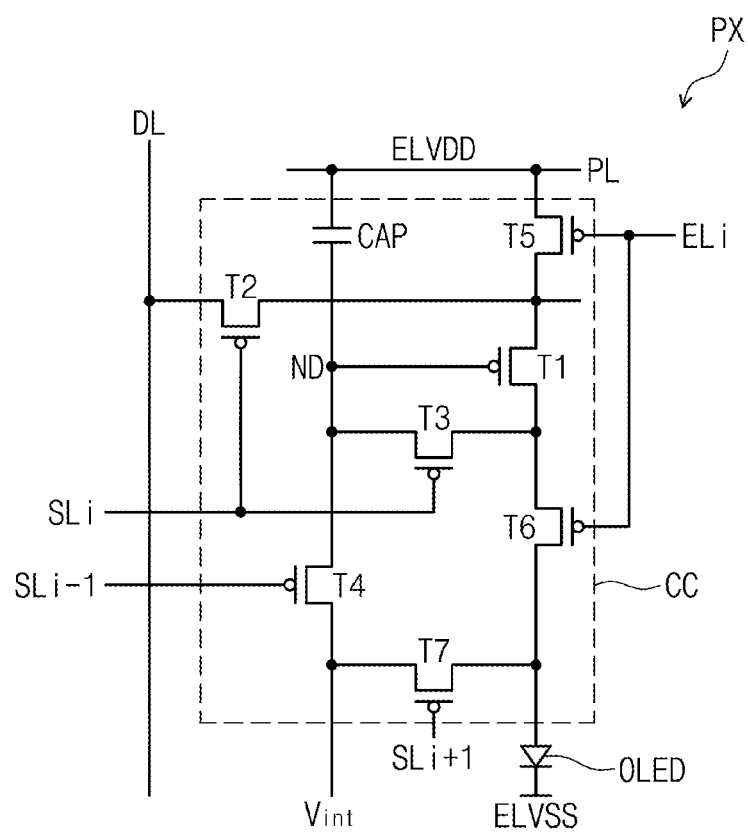
FIG. 5 is a diagram illustrating an equivalent circuit of one pixel illustrated in FIG. 4.

FIG. 5 is a diagram illustrating an equivalent circuit of one pixel illustrated in FIG. 4.

Referring to FIG. 5, the pixel PX may include a light emitting element OLED and a pixel circuit CC. The pixel circuit CC may include a plurality of transistors T1 to T7 and a capacitor CAP. The pixel circuit CC may control the amount of current flowing through the light emitting element OLED in response to the data voltage. The light emitting element OLED may generate light having a predetermined luminance in response to the amount of current provided from the pixel circuit CC.

Each of the transistors T1 to T7 may include an input electrode (or a source electrode), an output electrode (or a drain electrode), and a control electrode (or a gate electrode). In the specification, for convenience, either the input electrode or the output electrode may be referred to as a first electrode and the other may be referred to as a second electrode.

The first electrode of the first transistor T1 may receive the first voltage ELVDD through the fifth transistor T5 and the second electrode may be connected to the anode electrode of the light emitting element OLED through the sixth transistor T6. The cathode of the light emitting element OLED may receive the second voltage ELVSS having a lower level than the first voltage ELVDD.

The first transistor T1 may be defined as a driving transistor. The first transistor T1 may control the amount of current flowing through the light emitting element OLED according to the voltage applied to the control electrode of the first transistor T1.

The second transistor T2 may be connected between the data line DL and the first electrode of the first transistor T1, and the control electrode of the second transistor T2 may be connected to the i-th scan line SLi. The second transistor T2 may be turned on by receiving the i-th scan signal Si through the i-th scan line SLi to electrically connect the data line DL and the first electrode of the first transistor T1.

The third transistor T3 may be connected between the second electrode and the control electrode of the first transistor T1. The control electrode of the third transistor T3 may be connected to the i-th scan line SLi. The third transistor T3 may be turned on by receiving the i-th scan signal Si through the i-th scan line SLi to electrically connect the second electrode and the control electrode of the first transistor T1. When the third transistor T3 is turned on, the first transistor T1 may be connected in the form of a diode.

The fourth transistor T4 may be connected between a node ND and an initialization power generation unit (not illustrated). The control electrode of the fourth transistor T4 may be connected to the i−1th scan line SLi−1. The fourth transistor T4 may be turned on by receiving the (i−1)-th scan signal Si−1 through the (i−1)-th scan line SLi−1 to provide the initialization voltage Vint to the node ND.

The fifth transistor T5 may be connected between the power line PL and the first electrode of the first transistor T1. The control electrode of the fifth transistor T5 may be connected to the i-th emission line EL1.

The sixth transistor T6 may be connected between the second electrode of the first transistor T1 and the anode electrode of the light emitting element OLED. The control electrode of the sixth transistor T6 may be connected to the i-th emission line EL1.

The seventh transistor T7 is connected between the initialization power generation unit (not illustrated) and the anode electrode of the light emitting element OLED. The control electrode of the seventh transistor T7 may be connected to the (i+1)-th scan line SLi+1. The seventh transistor T7 receives the (i+1)-th scan signal Si+1 through an (i+1)-th scan line SLi+1 and is turned on to provide an initialization voltage Vint to the anode electrode of the light emitting element OLED.

The capacitor CAP may be disposed between the power line PL and the node ND. The capacitor CAP may store a data voltage. When the fifth transistor T5 and the sixth transistor T6 are turned on according to the voltage stored in the capacitor CAP, the amount of current flowing through the first transistor T1 can be determined.

In FIG. 5, the transistors T1 to T7 are illustrated based on the PMOS. However, the inventive concept is not limited thereto and in another embodiment of the inventive concept, the transistors T1 to T7 may be NMOS.

Figure 6:
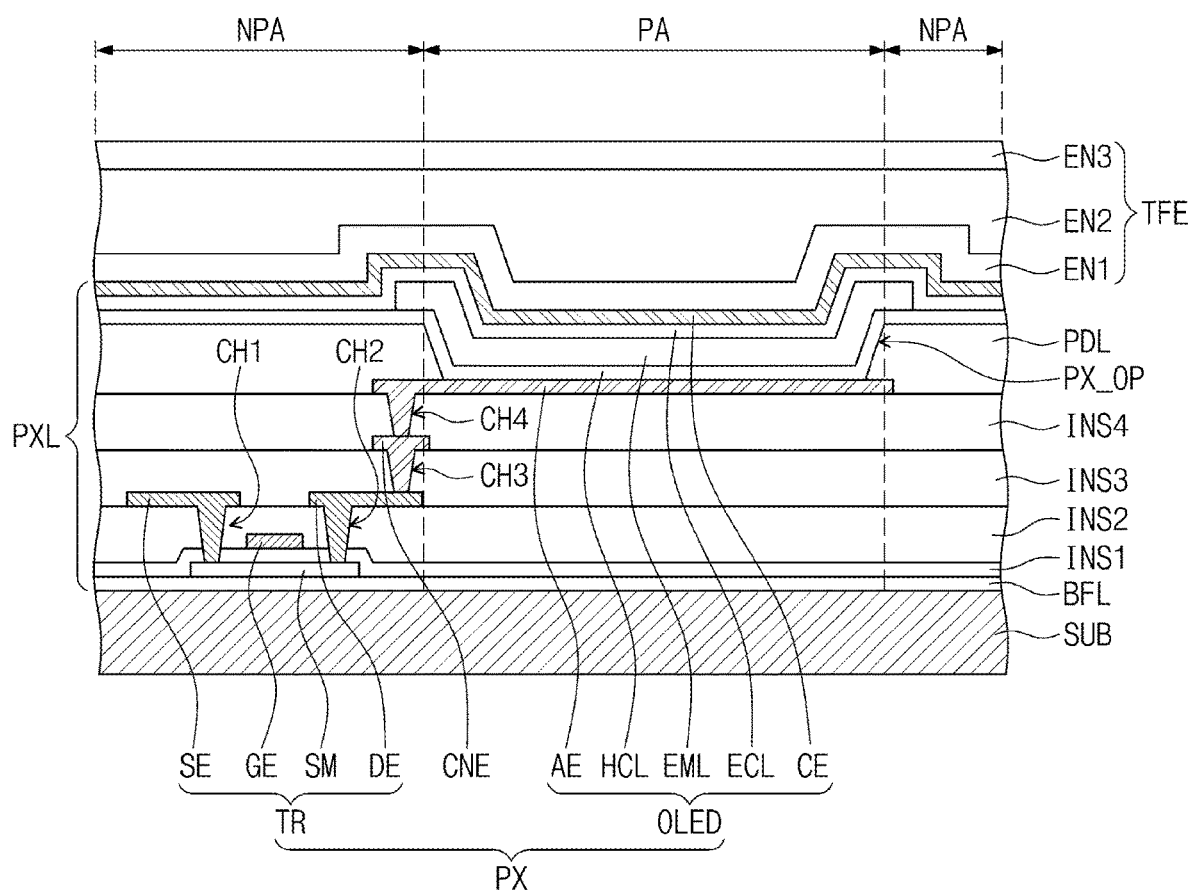
FIG. 6 is a cross-sectional view of a portion corresponding to the light emitting element illustrated in FIG. 5 by way of example.

FIG. 6 is a view exemplarily illustrating a cross-section of a portion corresponding to the light emitting element illustrated in FIG. 5.

Referring to FIG. 6, a pixel PX includes a light emitting element OLED and a transistor TR connected to the light emitting element OLED. The transistor TR may refer to the sixth transistor TR6 illustrated in FIG. 5. The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. The display area DA of the display panel DP may include a light emitting area PA corresponding to each of the pixels PX and a non-light emitting area NPA around the light emitting area PA. The light emitting element OLED of a pixel PX may be disposed in the light emitting area PA, and the transistor TR of the pixel PX may be disposed in the non-light emitting area NPA. The buffer layer BFL is disposed on the substrate SUB, and the buffer layer BFL may include an inorganic material.

The semiconductor layer SM of the transistor TR may be disposed on the buffer layer BFL. The semiconductor layer SM may include a semiconductor of an inorganic material such as amorphous silicon or poly silicon, or an organic semiconductor. Additionally, the semiconductor layer SM may include an oxide semiconductor. Although not illustrated in FIG. 6, the semiconductor layer SM may include a source area, a drain area, and a channel area between the source area and the drain area.

The first insulating layer INS1 may be disposed on the buffer layer BFL so as to cover the semiconductor layer SM. The first insulating layer INS1 may include an inorganic material. The gate electrode GE of the transistor TR overlapping the semiconductor layer SM may be disposed on the first insulating layer INS1. The gate electrode GE may be disposed to overlap the channel area of the semiconductor layer SM.

The second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be spaced from each other and disposed on the second insulating layer INS2. The source electrode SE may be connected to the source area of the semiconductor layer SM through a first contact hole CH1 that is defined in the first insulating layer INS1 and the second insulating layer INS2. The drain electrode DE may be connected to the drain area of the semiconductor layer SM through a second contact hole CH2 that is defined in the first insulating layer INS1 and the second insulating layer INS2.

The third insulating layer INS3 may be disposed on the second insulating layer INS2 to cover the source electrode SE and the drain electrode DE of the transistor TR. The third insulating layer INS3 may include an organic material. A connection electrode CNE may be disposed on the third insulating layer INS3. The connection electrode CNE may be connected to the drain electrode DE through the third contact hole CH3 defined in the third insulating layer INS3.

A fourth insulating layer INS4 may be disposed on the third insulating layer INS3 to cover the connection electrode CNE. The fourth insulating layer INS4 may include an organic material. The first electrode AE may be disposed on the fourth insulating layer INS4. The first electrode AE may include a connection electrode part that may be connected to the connection electrode CNE through the fourth contact hole CH4 defined in the fourth insulating layer INS4.

A pixel defining film PDL exposing a predetermined portion of the first electrode AE may be disposed on the first electrode AE and the fourth insulating layer INS4. An opening part PX_OP to expose a predetermined portion of the first electrode AE may be defined in the pixel defining film PDL.

The hole control layer HCL may be disposed on the first electrode AE and the pixel defining film PDL. One portion of the hole control layer HCL co-planar with the pixel defining film PDL may be disposed in the light emitting area PA. Other portions of the hole control layer HCL may be disposed on a plane above the pixel defining film PDL in the non-light emitting areas NPA.

The hole control layer HCL may be commonly disposed in the light emitting area PA and the non-light emitting area NPA. The hole control layer HCL may include a hole transport layer and a hole injection layer.

The light emitting layer EML may be disposed on the hole control layer HCL. The light emitting layer EML may follow a contour of the hole control layer HCL. A majority of a portion of the light emitting layer EML co-planar with the pixel defining film PDL may be disposed in the light emitting area PA. Smaller portions of the light emitting layer EML may be disposed on a plane above the pixel defining film PDL in the non-light emitting areas NPA.

The light emitting layer EML may be disposed in an area corresponding to the opening part PX_OP. That is, the light emitting layer EML may be formed separately from each other in the pixels PX. The light emitting layer EML may include organic materials and/or inorganic materials. The light emitting layer EML may be configured to generate light of any one of red, green, and blue. However, the inventive concept is not limited thereto and the light emitting layer EML may generate white light by a combination of organic materials generating red, green, and blue.

The electron control layer ECL may be disposed on the light emitting layer EML. The electron control layer ECL may follow a contour of the light emitting layer ECL. One portion of the electron control layer ECL co-planar with the pixel defining film PDL may be disposed in the light emitting area PA. Other portions of the electron control layer ECL may extend into the non-light emitting areas NPA on a plane above the pixel defining film PDL.

The electron control layer ECL may be disposed on the hole control layer HCL to cover the light emitting layer EML. That is, the electron control layer ECL may be commonly disposed in the light emitting area PA and the non-light emitting area NPA. The electron control layer ECL may include an electron transport layer and may further include an electron injection layer. The second electrode CE may be disposed on the electron control layer ECL. The second electrode CE may be commonly disposed in the pixels PX.

The thin film encapsulation layer TFE may be disposed on a light emitting element OLED. The thin film encapsulation layer TFE may be disposed on the second electrode CE to cover the light emitting element OLED. The layer between the substrate SUB and the thin film encapsulation layer TFE may be defined as a pixel layer PXL.

The thin film encapsulation layer TFE may include a first sealing layer EN1 disposed on the second electrode CE, a second sealing layer EN2 disposed on the first sealing layer EN1, and a third sealing layer EN3 disposed on the second sealing layer EN2. The first sealing layer EN1 may follow a contour of the second electrode CE. A bottom surface of the second sealing layer EN2 may follow a contour of the first sealing layer EN1. The first and third sealing layers EN1 and EN3 may include an inorganic material and protect the pixel layer PXL from moisture and/or oxygen. The second sealing layer EN2 may include an organic material and may protect the pixel layer PXL from foreign materials such as dust particles.

The first voltage ELVDD may be applied to the first electrode AE, and the second voltage ELVSS may be applied to the second electrode CE. In one aspect of the device, an exciton is formed as holes and electrons injected to the light emitting layer EML are combined and the light emitting element (OLED) may emit light as the excitons transition to the ground state. The light emitting element OLED may emit light, so that an image may be displayed.

Figure 7:
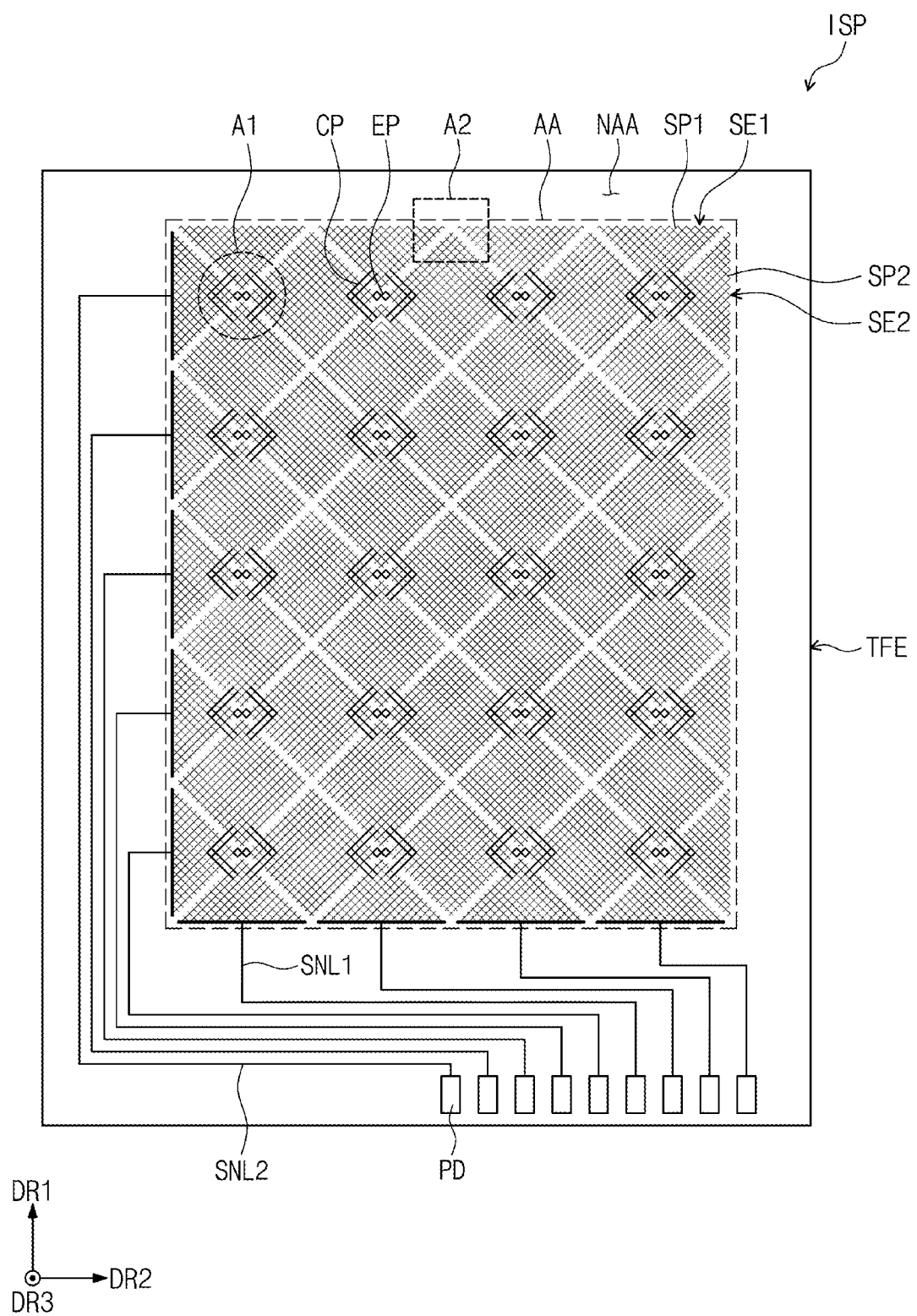
FIG. 7 is a plan view illustrating an input detection part according to an embodiment of the inventive concept.

FIG. 7 is a plan view of an input detection part according to an embodiment of the inventive concept.

Referring to FIG. 7, the input detection part ISP may include a plurality of detection electrodes SE1 and SE2, a plurality of wirings SNL1 and SNL2, and a plurality of pads PD. The detection electrodes SE1 and SE2, the wirings SNL1 and SNL2, and the pads PD may be disposed on the thin film encapsulation layer TFE.

The planar area of the input detection part ISP may include an active area AA and an inactive area NAA around the active area AA. The detection electrodes SE1 and SE2 may be disposed in the active area AA, and the pads PD may be disposed in the inactive area NAA.

The wirings SNL1 and SNL2 may be connected to one end of the detection electrodes SE1 and SE2, and may extend to the inactive area NAA to be connected to the pads PD. The pads PD may be connected to an input detection control unit (not illustrated) configured to control an input detection part ISP through a flexible printed circuit board (not illustrated).

The detection electrodes SE1 and SE2 may include a plurality of first detection electrodes SE1 extending in the first direction DR1 and arranged in the second direction DR2 and a plurality of second detection electrodes SE2 extending in the second direction DR2 and arranged in the first direction DR1. The wirings SNL1 and SNL2 may include a plurality of first signal wirings SNL1 connected to the first detection electrodes SE1 and a plurality of second signal wirings SNL2 connected to the second detection electrodes SE2.

The second detection electrodes SE2 may extend to insulate and intersect the first detection electrodes SE1. The first detection electrodes SE1 may be defined as output detection electrodes, and the second detection electrodes SE2 may be defined as input detection electrodes.

The input detection part ISP may be driven in a mutual sensing mode. For example, each of the second detection electrodes SE2 may be operated as a driving electrode, and each of the first detection electrodes SE1 may be operated as a sensing electrode. Driving signals may be applied to the second detection electrodes SE2 through the second signal wirings SL2, and sensing signals may be outputted from the first detection electrodes SE1 through the first signal wirings SL1.

Each of the first detection electrodes SE1 may include a plurality of first detection parts SP1 arranged in a first direction DR1 and a plurality of first conductive patterns CP connecting the first detection parts SP1. Each of the first conductive patterns CP may be disposed between two first detection parts SP1 adjacent to each other in the first direction DR1 to electrically connect the two first detection parts SP1. The first conductive patterns CP may be defined as a bridge pattern or a connection pattern.

Each of the second detection electrodes SE2 may include a plurality of second detection parts SP2 arranged in the second direction DR2 and a plurality of extension patterns EP connecting the second detection parts SP2. Each of the extension patterns EP may be disposed between two second detection parts SP2 adjacent to each other in the second direction DR2 to electrically connect the two second detection parts SP2.

The first detection parts SP1 and the second detection parts SP2 may have a mesh shape. The first detection parts SP1 and the second detection parts SP2 do not overlap each other and are spaced apart from each other, and may be alternately arranged. Capacitance may be formed by the first detection parts SP1 and the second detection parts SP2. The extension patterns EP may not overlap the first conductive patterns CP.

The first and second detection parts SP1 and SP2 and the extension patterns EP may be disposed on the same layer. The first conductive patterns CP may be disposed on a different layer from the first and second detection parts SP1 and SP2 and the extension patterns EP.

Figure 8:
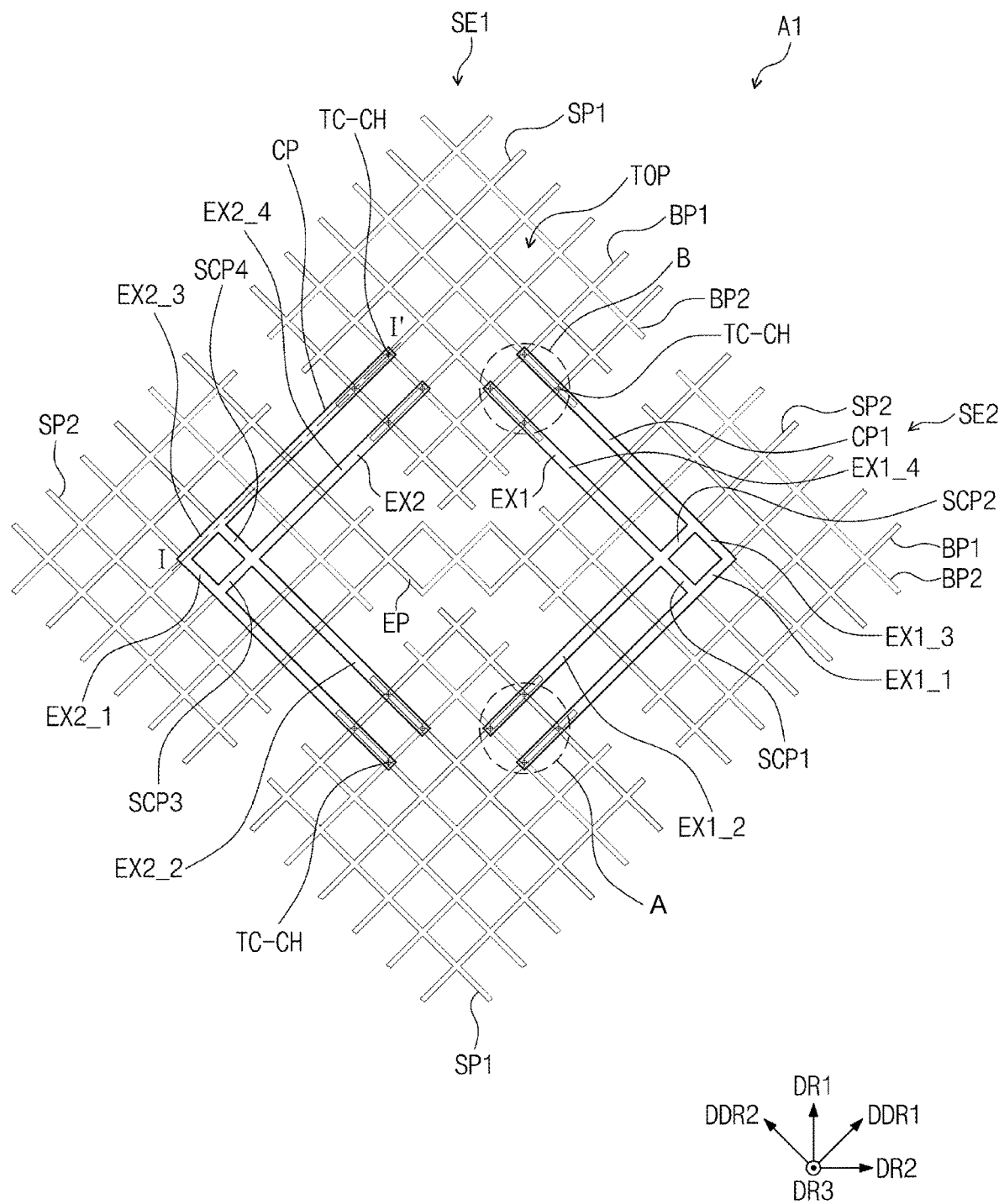
FIG. 8 is an enlarged view of the first area A1 illustrated in FIG. 7.
Figure 9:
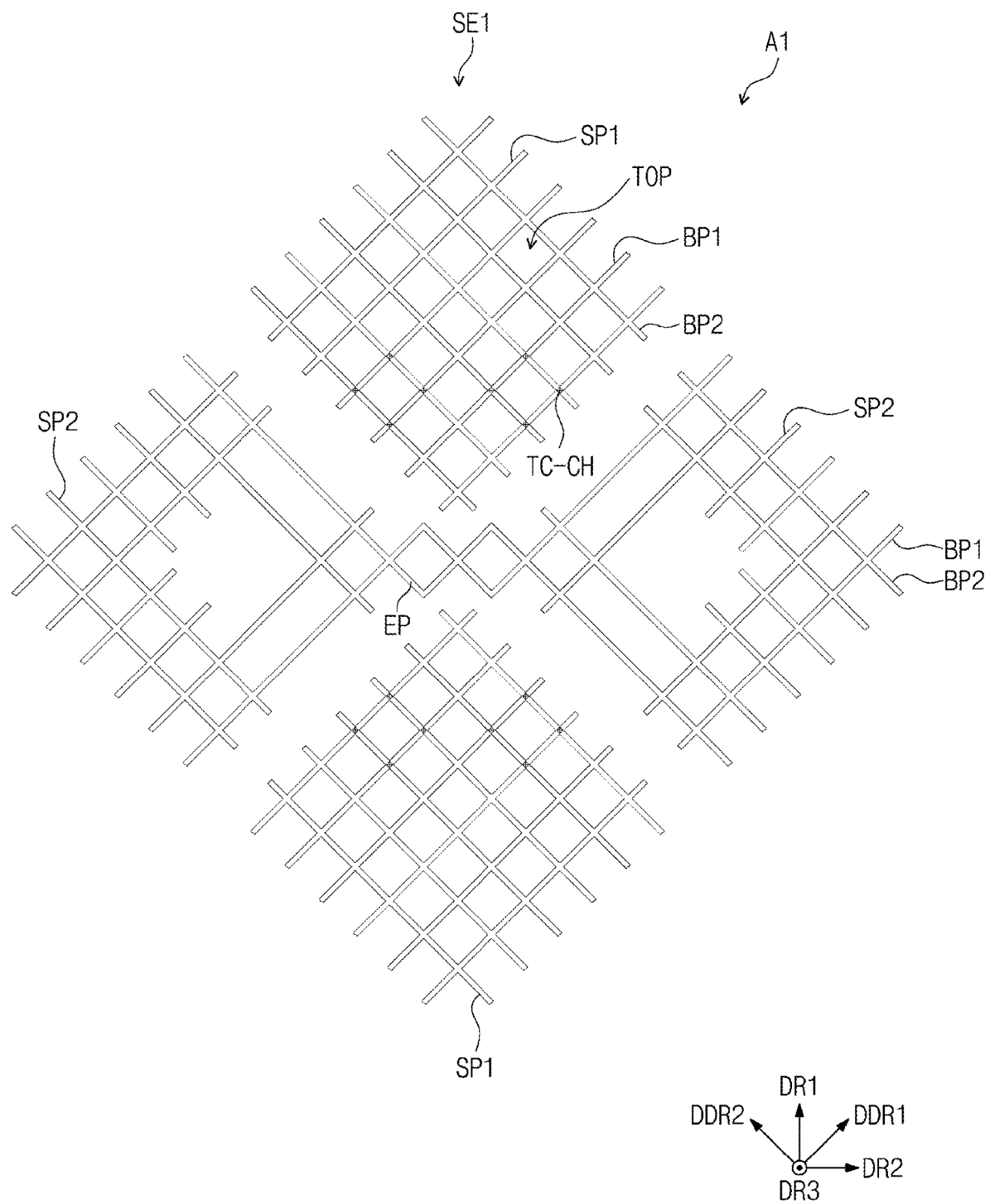
FIG. 9 is a view illustrating only the first and second detection parts and the extension pattern in FIG. 8.
Figure 10:
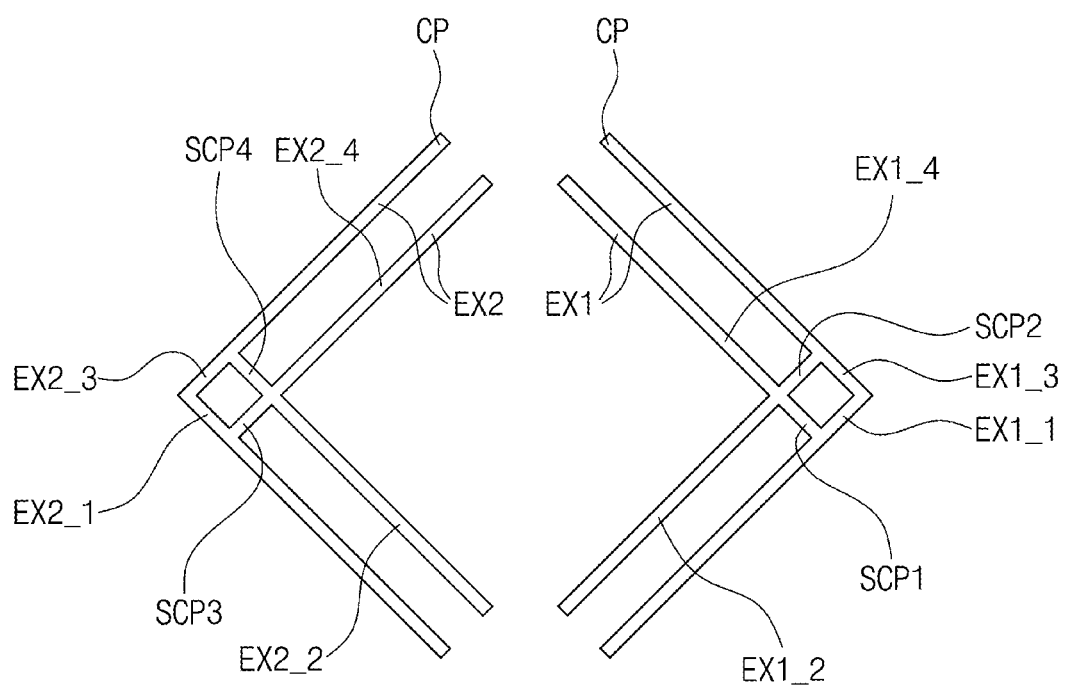
FIG. 10 is a view illustrating only the first conductive pattern in FIG. 8.
Figure 10:
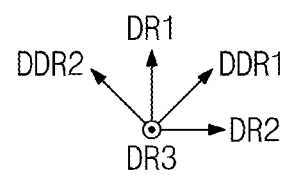

FIG. 8 is an enlarged view of the first area A1 illustrated in FIG. 7. FIG. 9 is a view illustrating only the first and second detection parts and the extension pattern in FIG. 8. FIG. 10 is a view illustrating only the first conductive pattern in FIG. 8.

For example, FIG. 8 illustrates two first detection parts SP1 adjacent to and spaced apart from each other and two second detection parts SP2 adjacent to and connected to each other.

Referring to FIGS. 8, 9, and 10, each of the first and second detection parts SP1 and SP2 may include a plurality of first branch parts BP1 extending in a first diagonal direction DDR1 and a plurality of second branch parts BP2 extending in the second diagonal direction DDR2. The first branch parts BP1 and second branch parts BP2 combine to have a mesh shape.

The first diagonal direction DR1 may be defined as a direction intersecting the first and second directions DR1 and DR2 on a plane defined by the first and second directions DR1 and DR2. The second diagonal direction DDR2 may be defined as a direction intersecting the first diagonal direction DDR1 on a plane defined by the first and second directions DR1 and DR2. For example, the first direction DR1 and the second direction DR2 may perpendicularly intersect each other, and the first diagonal direction DR1 and the second diagonal direction DR2 may perpendicularly intersect each other.

The first branch parts BP1 of each of the first and second detection parts SP1 and SP2 may intersect the second branch parts BP2 of each of the first and second detection parts SP1 and SP2 and may be formed integrally with each other. The rhombic touch opening parts TOP may be defined by the first branch parts BP1 and the second branch parts BP2.

The first conductive pattern CP may extend not to overlap the extension pattern EP so as to electrically connect the first detection parts SP1 adjacent to each other in the first direction DR1. The first conductive pattern CP may be connected to the first detection parts SP1 through a plurality of contact holes TC-CH. The first conductive pattern CP may extend toward the first detection parts SP1 through areas overlapping the second detection parts SP2 adjacent to each other in the second direction DR2.

The extension pattern EP may be disposed between the first detection parts SP1 and may extend from the second detection parts SP2. The second detection parts SP2 and the extension pattern EP may be integrally formed. The extension pattern EP has a mesh shape and may extend from each of the second detection parts SP2. The extension pattern EP, the first detection parts SP1, and the second detection parts SP2 may be formed by simultaneously patterning the same material. The extension patterns EP, the first detection parts SP1, and the second detection parts SP2 disposed on the same layer may be defined as a second conductive pattern.

The first conductive pattern CP may include a first extension part EX1 and a second extension part EX2 having a shape symmetrical with the first extension part EX1. The extension pattern EP may be disposed between the first extension part EX1 and the second extension part EX2.

The first extension part EX1 may extend through an area overlapping one of the second detection parts SP2 and may be connected to upper and lower first detection parts SP1. The second extension part EX2 may extend through an area overlapping another of the second detection parts SP2 and may be connected to the upper and lower first detection parts SP1.

In FIGS. 8 and 9, the first detection parts SP1 are referred to as an upper first detection part SP1 and a lower first detection part SP1 according to a relative arrangement position in the drawing figures. In addition, the second detection parts SP2 are defined as a left second detection part SP2 and a right second detection part SP2 according to a relative arrangement position in the drawing figures.

Predetermined portions of the first and second extension parts EX1 and EX2 adjacent to one side of the first and second extension parts EX1 and EX2 may be connected to the lower first detection part SP1 through the plurality of contact holes TC-CH. Predetermined portions of the first and second extension parts EX1 and EX2 adjacent to the other side of the first and second extension parts EX1 and EX2 may be connected to the upper first detection part SP1 through the plurality of contact holes TC-CH.

The contact holes TC-CH are defined in the insulating layer disposed on the first conductive pattern CP, and the structure of the contact holes TC-CH will be illustrated in FIG. 11 below.

The first extension part EX1 may include a first sub extension part EX1_1 and a second sub extension part EX1_2 extending in the first diagonal direction DDR1, a third sub extension part EX1_3 and a fourth sub extension part EX1_4 extending in the second diagonal direction DDR2, a first sub-conductive pattern SCP1 extending in the second diagonal direction DDR2, and a second sub-conducting pattern SCP2 extending in the first diagonal direction DDR1. The first sub-conductive patterns SCP1 is a portion of the fourth sub extension part EX1_4. The second sub-conducting pattern SCP2 is a portion of the second sub extension part EX1_2.

Predetermined portions of the first and second sub-extension parts EX1_1 and EX1_2 adjacent to one side of the first and second sub-extension parts EX1_1 and EX1_2 may be connected at area "A" to the lower first detection part SP1 through the plurality of contact holes TC-CH. Predetermined portions of the third and fourth sub-extension parts EX1_3 and EX1_4 adjacent to one side of the third and fourth sub-extension parts EX1_3 and EX1_4 may be connected at "B" to the upper first detection part SP1 through the plurality of contact holes TC-CH.

The other side of the first sub-extension part EX1_1 may extend from the other side of and be adjacent to the third sub-extension part EX1_3. The other side of the second sub-extension part EX1_2 may extend from and be adjacent to the other side of the fourth sub-extension part EX1_4. The first sub-conductive pattern SCP1 may extend in the second diagonal direction DDR2 from the other side of the fourth sub-extension part EX1_4 and may extend to the first sub-extension part EX1_1. The second sub-conductive pattern SCP2 may extend in the first diagonal direction DDR1 from the other side of the second sub-extension part EX1_2 and may extend to the third sub-extension part EX1_3.

The first sub-extension part EX1_1, the second sub-extension part EX1_2, the third sub-extension part EX1_3, the fourth sub-extension part EX1_4, the first sub-conductive pattern SCP1, and the second sub-conductive pattern SCP2 may be integrally formed.

The first and second sub-extension parts EX1_1 and EX1_2 may extend to intersect a predetermined number of second branch parts BP2 adjacent to the lower first detection part SP1 among the second branch parts BP2 of the right second detection part SP2. As illustrated in FIG. 9, some of the first branch parts BP1 of the right second detection part SP2 may not be disposed in areas overlapping the first and second sub-extension parts EX1_1 and EX1_2 and the second sub-conductive pattern SCP2.

The third and fourth sub-extension parts EX1_3 and EX1_4 may extend to intersect a predetermined number of first branch parts BP1 adjacent to the upper first detection part SP1 of the first branch parts BP1 of the right second detection part SP2. As illustrated in FIG. 9, some of the second branch parts BP2 of the right second detection part SP2 may not be disposed in areas overlapping the third and fourth sub-extension parts EX1_3 and EX1_4 and the first sub-conductive pattern SCP1.

The second extension part EX2 may include a fifth sub-extension part EX2_1 and a sixth sub-extension part EX2_2 extending in the second diagonal direction DDR2, a seventh sub-extension part EX2_3 and an eighth sub-extension part EX2_4 extending in the first diagonal direction DDR1, a third sub-conductive pattern SCP3 extending in the first diagonal direction DDR1, and a fourth sub-conductive pattern SCP4 extending in the second diagonal direction DDR2.

The left second detection part SP2 may have a structure symmetric to the right second detection part SP2, and the second extension part EX2 may have a structure symmetric to the first extension part EX1. Accordingly, the fifth to eighth sub-extension parts EX2_1 to EX2_4 may connect the first detection parts SP1 through the left second detection part SP2. Further, predetermined portions of the fifth to eighth sub-extension parts EX2_1 to EX2_4 may be connected to the first detection parts SP1 through a plurality of contact holes CH.

The fifth to eighth sub-extension parts EX2_1 to EX2_4 may intersect some of the first and second branch parts BP1 and BP2 of the left second detection part SP2. Also, the first and second branch parts BP1 and BP2 of the left second detection part SP2 may not be disposed in areas overlapping the fifth to eighth sub-extension parts EX2_1 to EX2_4 and the third and fourth sub-conductive patterns SCP3 and SCP4.

Figure 11:
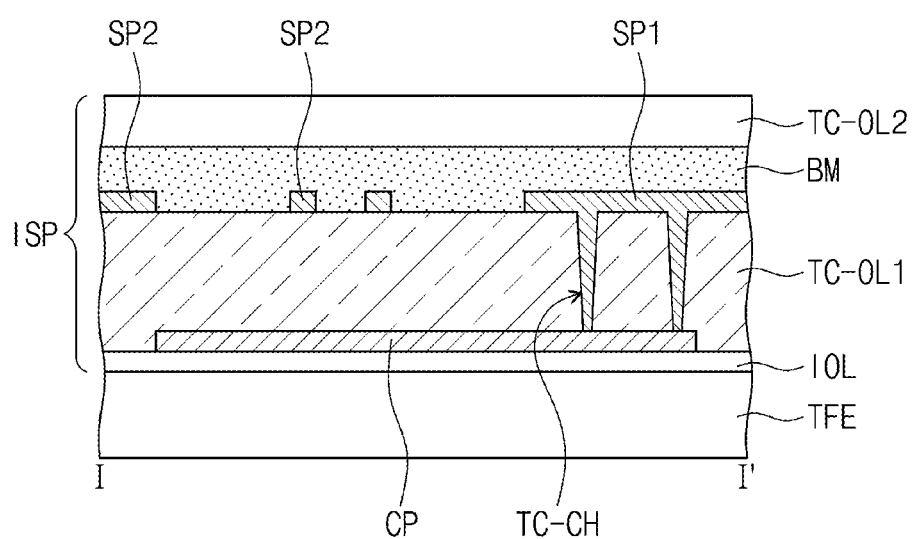
FIG. 11 is a cross-sectional view taken along line I-I' of FIG. 8.

FIG. 11 is a cross-sectional view taken along line I-I' of FIG. 8.

Referring to FIG. 11, an input detection part ISP may further include an insulating layer IOL disposed on a thin film encapsulation layer TFE. The insulating layer IOL may include an inorganic material. Illustratively, one insulating layer IOL is illustrated, but is not limited thereto. More inorganic insulating layers may be disposed on the thin film encapsulation layer TFE.

The first conductive pattern CP may be disposed on the insulating layer IOL. The first conductive pattern CP may be directly disposed on the insulating layer IOL. When a plurality of insulating layers IOL are provided, the first conductive pattern CP may be directly disposed on the uppermost insulating layer. The first insulating layer TC-OL1 may be disposed on the first conductive pattern CP and the insulating layer IOL. The first insulating layer TC-OL1 may include an organic material.

First detection parts SP1 and second detection parts SP2 may be disposed on the first insulating layer TC-OL1. The extension pattern EP integrally formed with the second detection parts SP2 may also be disposed on the first insulating layer TC-OL1. The first conductive pattern CP may be connected to the first detection parts SP1 through a plurality of contact holes TC-CH defined in the first insulating layer TC-OL1.

The black matrix BM may be disposed on the first insulating layer TC-OL1 to cover the first detection parts SP1 and the second detection parts SP2. A second insulating layer TC-OL2 may be disposed on the black matrix BM. The second insulating layer TC-OL2 may include an organic material.

Figure 12:
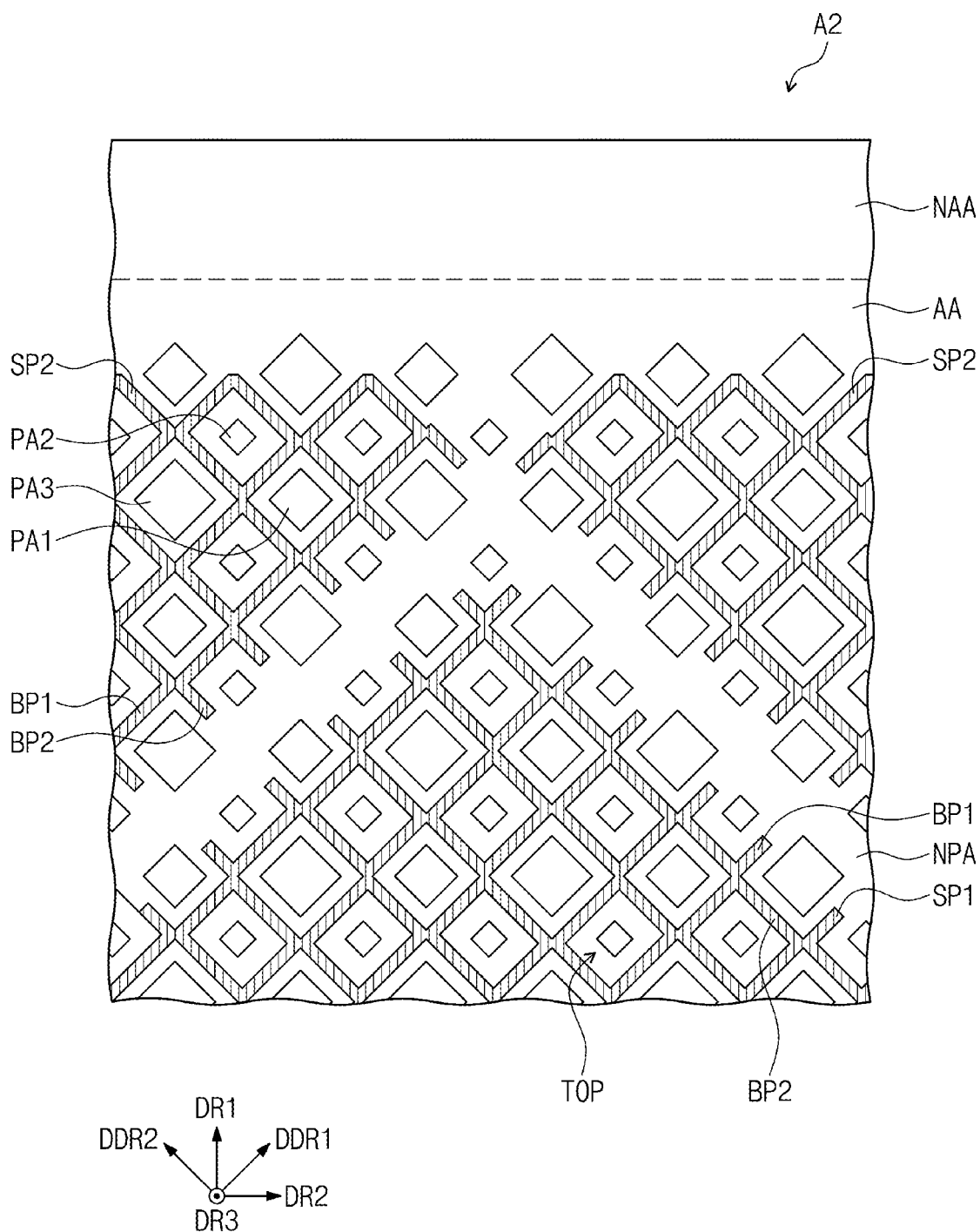
FIG. 12 is an enlarged view of the second area A2 illustrated in FIG. 7.

FIG. 12 is an enlarged view of the second area A2 illustrated in FIG. 7.

For example, FIG. 12 illustrates light emitting areas PA1, PA2, and PA3 together with first and second detection parts SP1 and SP2.

Referring to FIG. 12, the light emitting area PA illustrated in FIG. 6 may be any one of the light emitting areas PA1, PA2, and PA3. The light emitting areas PA1, PA2, and PA3 may be arranged in a first diagonal direction DDR1 and a second diagonal direction DDR2. The first and second branch parts BP1 and BP2 of the first and second detection parts SP1 and SP2 may overlap a non-light emitting area NPA between the light emitting areas PA1, PA2 and PA3.

The light emitting areas PA1, PA2, and PA3 may include a plurality of first light emitting areas PA1 configured to display red, a plurality of second light emitting areas PA2 configured to display green, and a plurality of third light emitting areas PA3 configured to display blue. The third light emitting areas PA3 may be larger than the first light emitting areas PA1 and the first light emitting areas PA1 may be larger than the second light emitting areas PA2.

The light emitting areas PA1, PA2, and PA3 may have a rhombus shape. The touch opening parts TOP may overlap the light emitting areas PA1, PA2, and PA3. The touch opening parts TOP may have a rhombus shape or other polygon corresponding to the shapes of the light emitting areas PA1, PA2, and PA3, and may have sizes corresponding to the light emitting areas PA1, PA2, and PA3.

Because the first and second detection parts SP1 and SP2 are disposed in the non-light emitting area NPA, the light generated in the light emitting areas PA1, PA2 and PA3 may be normally emitted without being affected by the first and second detection parts SP1 and SP2.

Figure 13:
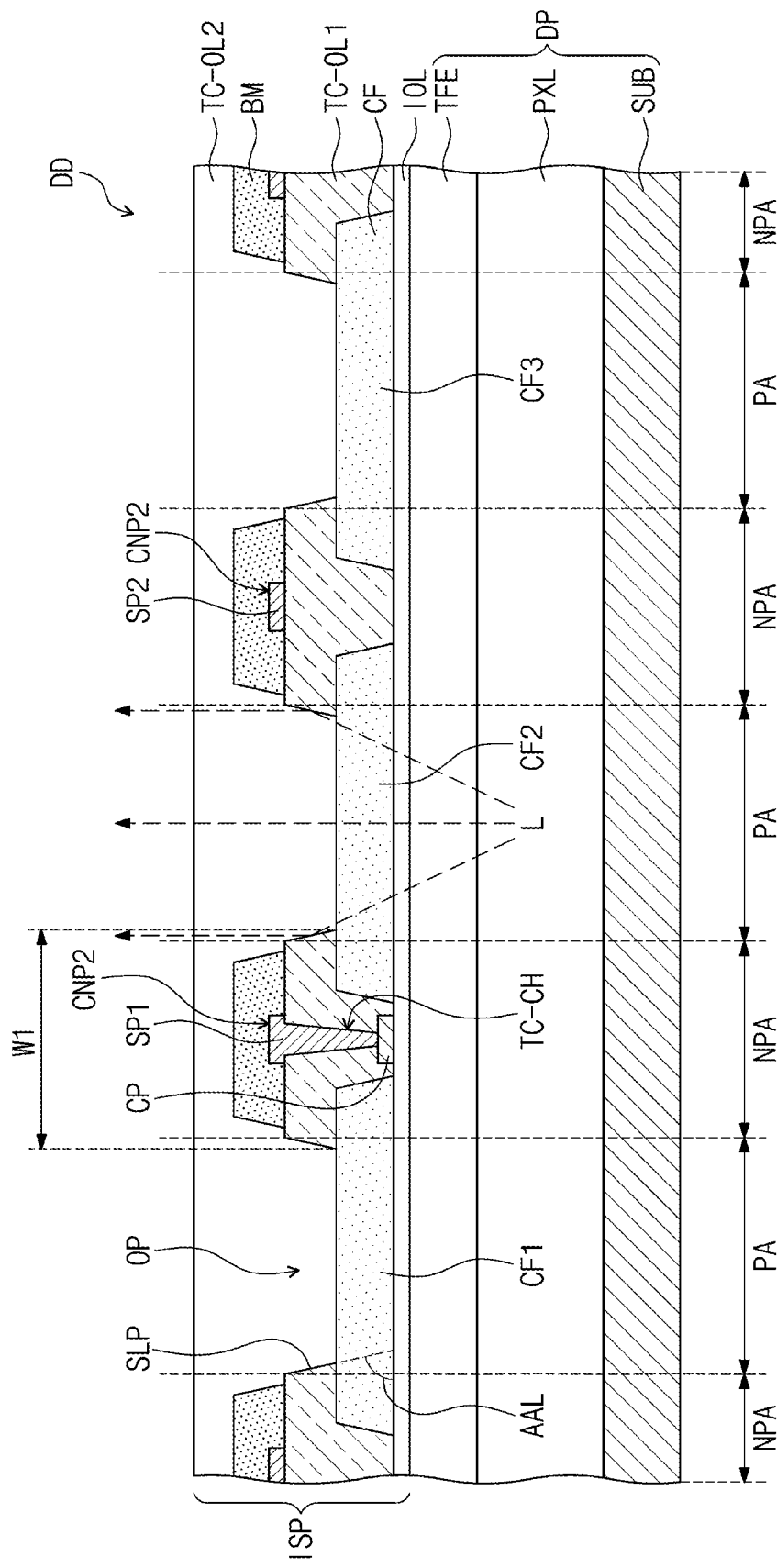
FIG. 13 is a diagram schematically illustrating a cross-sectional configuration of the display panel and the input detection part illustrated in FIG. 2.

FIG. 13 is a diagram schematically illustrating a cross-sectional configuration of the display panel and the input detection part illustrated in FIG. 2.

The light emitting areas PA illustrated in FIG. 13 may correspond to the light emitting areas PA1, PA2, and PA3 illustrated in FIG. 12. For example, FIG. 13 illustrates that the light emitting areas PA have the same size. In addition, in FIG. 13, for example, the first conductive pattern CP, the first detection part SP1, and the second detection part SP2 are illustrated one by one.

Referring to FIG. 13, the display panel DP may include a plurality of light emitting areas PA and a non-light emitting area NPA between the light emitting areas PA. The input detection part ISP may include an insulating layer IOL, a first conductive pattern CP, a second conductive pattern CNP2, a color filter layer CF, a first insulating layer TC-OL1, a black matrix BM, and a second insulating layer TC-OL2. The first insulating layer TC-OL1, the black matrix BM, and the second insulating layer TC-OL2 may be the first insulating layer TC-OL1, the black matrix BM, and the second insulating layer TC-OL2 illustrated in FIG. 11, respectively.

The color filter layer CF and the first conductive pattern CP may be disposed on the thin film encapsulation layer TFE of the display panel DP. Specifically, the color filter layer CF may overlap the light emitting areas PA and may be disposed on the insulating layer IOL. The color filter layer CF may be directly disposed on the insulating layer IOL. When a plurality of insulating layers IOL are provided, the color filter layer CF may be directly disposed on the uppermost insulating layer. The first conductive pattern CP may overlap the non-light emitting area NPA and may be disposed on the insulating layer IOL.

The color filter layer CF may extend to a portion of the non-light emitting area NPA adjacent to each of the light emitting areas PA. The color filter layer CF may include a plurality of color filters CF1, CF2, and CF3. The color filters CF1, CF2, and CF3 may include a first color filter CF1, a second color filter CF2, and a third color filter CF3.

The first, second, and third color filters CF1, CF2, and CF3 may have different colors. For example, the first, second, and third color filters CF1, CF2, and CF3 may include a red color filter, a green color filter, and a blue color filter, respectively.

The red color filter may be disposed on the first light emitting area PA1 illustrated in FIG. 12. The green color filter may be disposed on the second light emitting area PA2 illustrated in FIG. 12. The blue color filter may be disposed on the third light emitting area PA3 illustrated in FIG. 12.

Each of the first, second, and third color filters CF1, CF2, and CF3 may extend to a portion of the non-light emitting area NPA adjacent to the corresponding light emitting area PA among the light emitting areas PA. The first, second, and third color filters CF1, CF2, and CF3 may be spaced apart from each other on a non-light emitting area NPA. A larger middle portion of the color filters CF1, CF2, and CF3 may be disposed in the light emitting areas PA than smaller side portions disposed in the non-light emitting areas NPA.

The first conductive pattern CP may be disposed between some of the color filters CF1, CF2, and CF3. For example, the first conductive pattern CP may be disposed between the first color filter CF1 and the second color filter CF2. FIG. 11 is the cross-sectional view of the non-light emitting area NPA in which the first and second branch parts BP1 and BP2 are disposed, and therefore, the color filters CF1, CF2, and CF3 illustrated in FIG. 13 are not illustrated in FIG. 11.

A first insulating layer TC-OL1 may be disposed on the insulating layer IOL. The first insulating layer TC-OL1 may be disposed on the first conductive pattern CP and the color filter layer CF. In the first insulating layer TC-OL1, opening parts OP overlapping the light emitting areas PA may be defined. Accordingly, the first insulating layer TC-OL1 may be disposed on the non-light emitting area NPA to cover the color filters CF1, CF2, and CF3 and the first conductive pattern CP. The color filters CF1, CF2, and CF3 may be exposed by the opening parts OP in the light emitting areas PA.

The side surfaces SLP of the first insulating layer TC-OL1 in which the opening parts OP are defined may have an inclining surface that forms an acute angle AAL with respect to the upper surface of the display panel DP. For example, based on the direction parallel to the upper surface of the display panel DP, the width of the first insulating layer TC-OL1 may be smaller toward the upper direction perpendicular to the upper surface of the display panel. A width W1 of the first insulating layer TC-OL1 may be defined as the distance between the opening parts OP. Side surfaces SLP of the first insulating layer TC-OL1 may be defined as reflective side surfaces. The first insulating layer TC-OL1 are primarily disposed in the non-light emitting areas NPA. Side surfaces SLP of the first insulating layer TC-OL1 may extend into the light-emitting areas PA.

The second conductive pattern CNP2 may overlap the non-light emitting area NPA and may be disposed on the first insulating layer TC-OL1. The second conductive pattern CNP2 may include a first detection part SP1 and a second detection part SP2. Although not illustrated in FIG. 13, the second conductive pattern CNP2 may include the extension pattern EP extending from the second detection part SP2. The second conductive pattern CNP2 may be connected to the first conductive pattern CP.

The black matrix BM may overlap the non-light emitting area NPA and may be disposed on the second conductive pattern CNP2. The black matrix BM may be disposed on the first insulating layer TC-OL1 to cover the second conductive pattern CNP2. The black matrix BM portions may be disposed totally within the non-light emitting areas NPA.

The second insulating layer TC-OL2 may be disposed on the color filter layer CF, the first insulating layer TC-OL1, and the black matrix BM. The second insulating layer TC-OL2 may be disposed to fill the opening parts OP. For example, the second insulating layer TC-OL2 may be provided on the color filter layer CF, the first insulating layer TC-OL1, and the black matrix BM through an inkjet process. The refractive index of the second insulating layer TC-OL2 may be greater than the refractive index of the first insulating layer TC-OL1.

The light L generated in the light emitting areas PA may travel upward. Because the refractive index of the second insulating layer TC-OL2 is greater than that of the first insulating layer TC-OL1, a total reflection phenomenon may occur at an interface between the first insulating layer TC-OL1 and the second insulating layer TC-OL2. Accordingly, the light L traveling toward the side surfaces SLP of the light L may be reflected from the side surfaces SLP of the first insulating layer TC-OL1 and travel upward. As a result, luminance may be increased in the light emitting areas PA.

The black matrix BM may block unnecessary light in a non-light emitting area NPA. The black matrix BM may include a black material that absorbs light.

The first, second, and third color filters CF1, CF2, and CF3 may convert external light into red, green, and blue. External light may be provided on the display device DD toward the display panel DP. If the first, second, and third color filters CF1, CF2, and CF3 are not used, external light may be reflected from the display panel DP and provided to the user. In this case, external light may be visible to the user, such as light reflected from the mirror.

However, as illustrated and described, external light is provided to the first, second, and third color filters CF1, CF2, and CF3 to be absorbed by the first, second, and third color filters CF1, CF2, and CF3, or to be converted to red, green, and blue in the first, second, and third color filters CF1, CF2, and CF3. Therefore, even if external light is provided to the display device DD, like the light emitting areas PA, the first, second, and third color filters CF1, CF2, and CF3 may be converted to red, green, and blue. As a result, reflection of external light is prevented, so that visibility of external light can be prevented.

A first layer including a color filter layer CF and a black matrix BM is disposed on the input detection part ISP, and a second layer including first and second insulating layers TC-OL1 and TC-OL2 may be disposed on the first layer. In this case, the input detection part ISP may include other inorganic insulating layers and other organic insulating layers instead of the first and second insulating layers TC-OL1 and TC-OL2. Also, an additional organic insulating layer may be disposed between the first layer and the second layer.

Therefore, when the first layer and the second layer are separately stacked on the input detection part ISP, the number of organic insulating layers used may increase, the manufacturing process may become complicated, and the thickness of the display device DD may increase.

In an embodiment of the inventive concept, a color filter layer CF, a black matrix BM, and first and second insulating layers TC-OL1 and TC-OL2 may be integrated and disposed in an input detection part ISP. Therefore, the number of organic insulating layers used is reduced, so that the process can be simplified and the thickness of the display device DD can be reduced.

Figure 14:
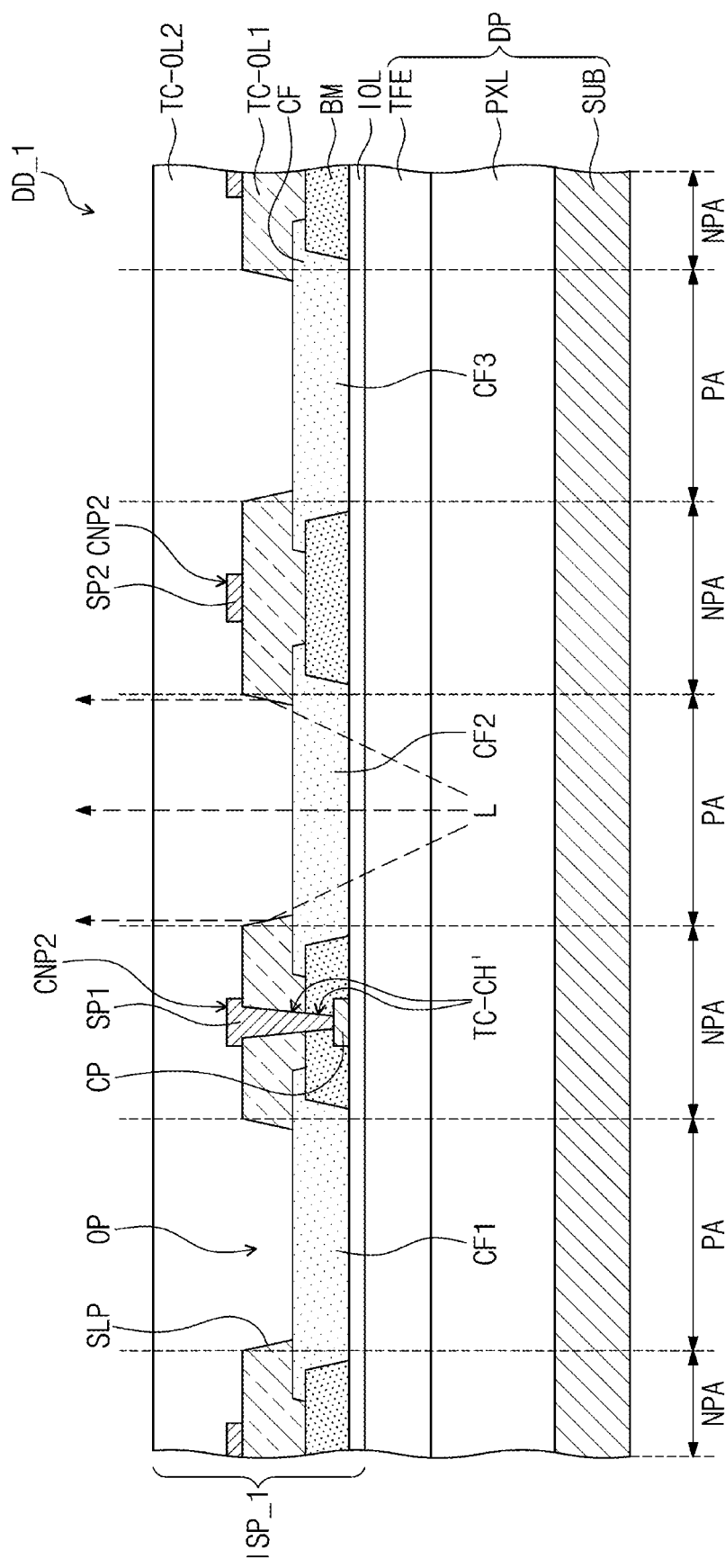
FIG. 14 is a view schematically illustrating a cross-sectional configuration of a display device according to another embodiment of the inventive concept.

FIG. 14 is a view schematically illustrating a cross-sectional configuration of a display device according to another embodiment of the inventive concept.

For example, in FIG. 14, cross-sections corresponding to FIG. 13 are illustrated as cross-sections of a display panel DP and an input detection part ISP_1.

Hereinafter, a configuration of the display device DD_1 illustrated in FIG. 14 will be described, mainly based on a configuration different from the configuration illustrated in FIG. 13, and the same configuration is illustrated using the same reference numerals.

Referring to FIG. 14, the black matrix BM may overlap the non-light emitting area NPA and may be disposed on the insulating layer IOL. The black matrix BM may be disposed between the color filters CF1, CF2, and CF3. Portions of the color filters CF1, CF2, and CF3 may overlap portions of the black matrix BM. The black matrix BM may be disposed on the first conductive pattern CP. The black matrix BM may be disposed on the insulating layer IOL to cover the first conductive pattern CP. The first insulating layer TC-OL1 may be disposed on the black matrix BM.

In FIG. 13, the black matrix BM may be disposed on the first insulating layer TC-OL1, but unlike this, in FIG. 14, the first insulating layer TC-OL1 may be disposed on the black matrix BM. In FIG. 14, except for positions at which the black matrix BM and the first insulating layer TC-OL1 are disposed, other configurations illustrated in FIG. 14 may be substantially the same as those illustrated in FIG. 13.

The second conductive pattern CNP2 may be disposed on the first insulating layer TC-OL1. The first conductive pattern CP may be connected to first detection parts SP1 defined as some second conductive pattern CNP2 among the second conductive patterns CNP2 through the contact holes TC-CH' defined in the first insulating layer TC-OL1 and the black matrix BM.

The second insulating layer TC-OL2 may be disposed on the color filter layer CF, the first insulating layer TC-OL1, and the second conductive pattern CNP2, and may fill the opening parts OP.

Figure 15:
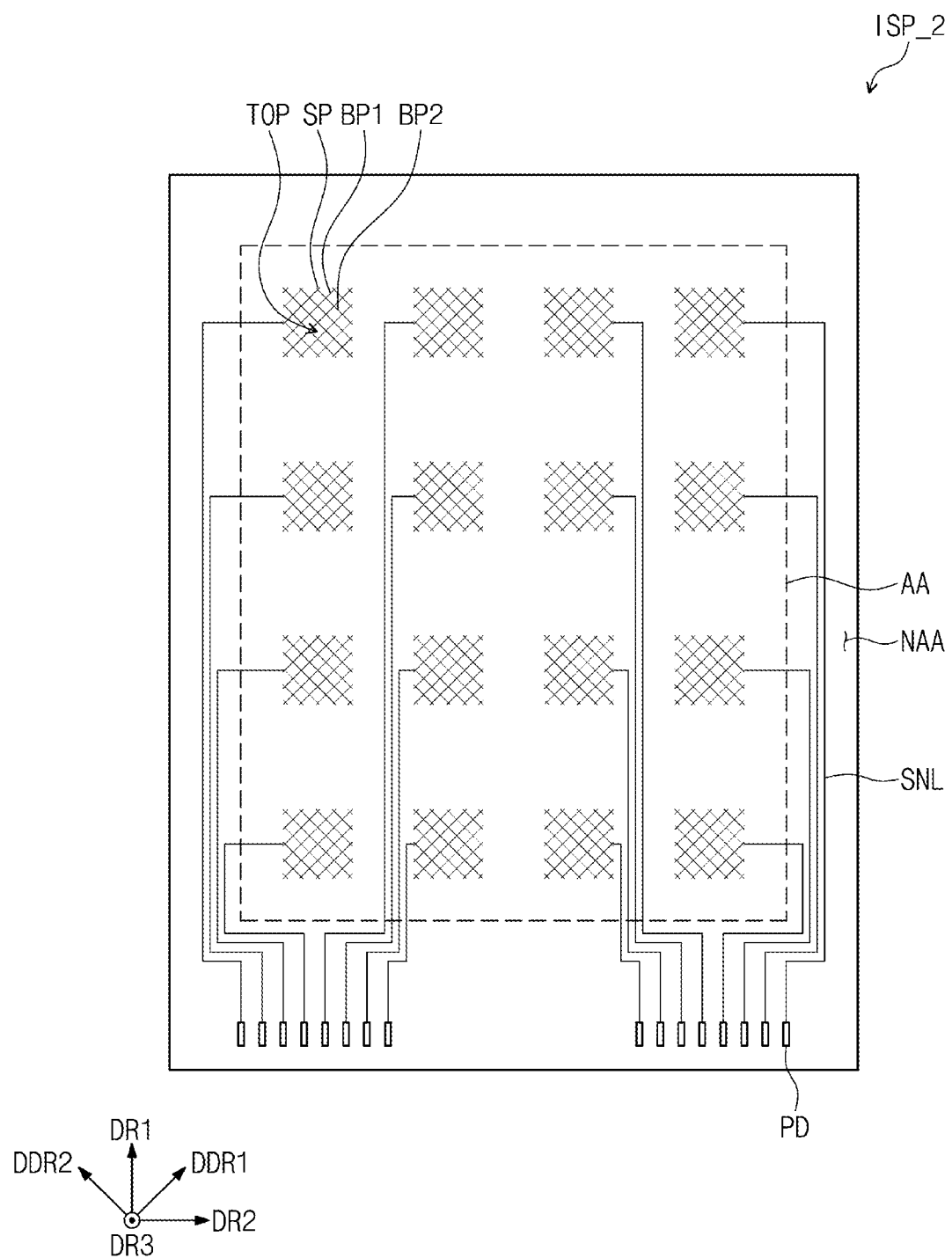
FIG. 15 is a plan view of an input detection part of a display device according to another embodiment of the inventive concept.

FIG. 15 is a plan view of an input detection part of a display device according to another embodiment of the inventive concept.

Referring to FIG. 15, the input detection part ISP_2 may include a plurality of detection parts SP, a plurality of wirings SNL, and a plurality of pads PD. The detection parts SP, the wirings SNL, and the pads PD may be disposed on a thin film encapsulation layer TFE.

The detection parts SP may be arranged in the first direction DR1 and the second direction DR2 to be arranged in a matrix shape, but the arrangement of the detection parts SP is not limited thereto. The detection parts SP may be disposed on the same layer. The detection parts SP may have a mesh shape.

Like the first and second detection parts SP1 and SP2 illustrated in FIG. 7, the detection parts SP may include a plurality of first branch parts BP1 extending in the first diagonal direction DDR1 and a plurality of second branch parts BP2 extending in the second diagonal direction DDR2. The first and second branch parts BP1 and BP2 may be integrally formed and disposed in a non-light emitting area NPA. Touch opening parts TOP overlapping the light emitting areas PA may be defined by the first and second branch parts BP1 and BP2.

The planar area of the input detection part ISP_2 may include an active area AA and an inactive area NAA surrounding the active area AA. Detection parts SP may be disposed in the active area AA, and pads PD may be disposed in the inactive area NAA. The wirings SNL may be connected to the detection parts SP, and may extend to the inactive area NAA and may be connected to the pads PD.

The input detection part ISP_2 may be driven in a self sensing mode to obtain coordinate information in a self-cap method. For example, each of the detection parts SP may be operated as a driving electrode and a detection electrode. Driving signals may be applied to the detection parts SP, and detection signals may be outputted from the detection parts SP.

Figure 16:
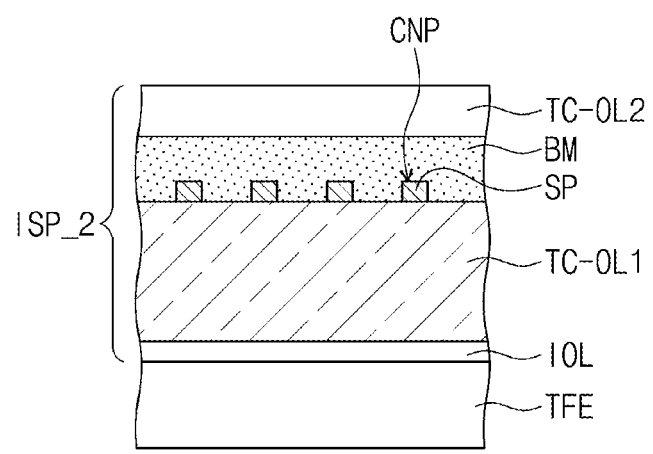
FIG. 16 is a view schematically illustrating a cross-section of a portion of the input detection part illustrated in FIG. 15.

FIG. 16 is a view schematically illustrating a cross-section of a portion of the input detection part ISP_2 illustrated in FIG. 15.

Illustratively, FIG. 16 illustrates a cross-section corresponding to FIG. 11. That is, a cross-section of a portion of the detection part SP disposed in a non-light emitting area NPA is illustrated in FIG. 16.

Referring to FIG. 16, an insulating layer IOL may be disposed on a thin film encapsulation layer TFE, and a first insulating layer TC-OL1 may be disposed on an insulating layer. A conductive pattern CNP may be disposed on the first insulating layer TC-OL1. The conductive pattern CNP may include detection parts SP. The black matrix BM may be disposed on the first insulating layer TC-OL1 to cover the detection parts SP. A second insulating layer TC-OL2 may be disposed on the black matrix BM.

The insulating layer IOL, the first insulating layer TC-OL1, the black matrix BM, and the second insulating layer TC-OL2 may be substantially the insulating layer IOL, the first insulating layer TC-OL1, the black matrix BM, and the second insulating layer TC-OL2 illustrated in FIG. 11.

Figure 17:
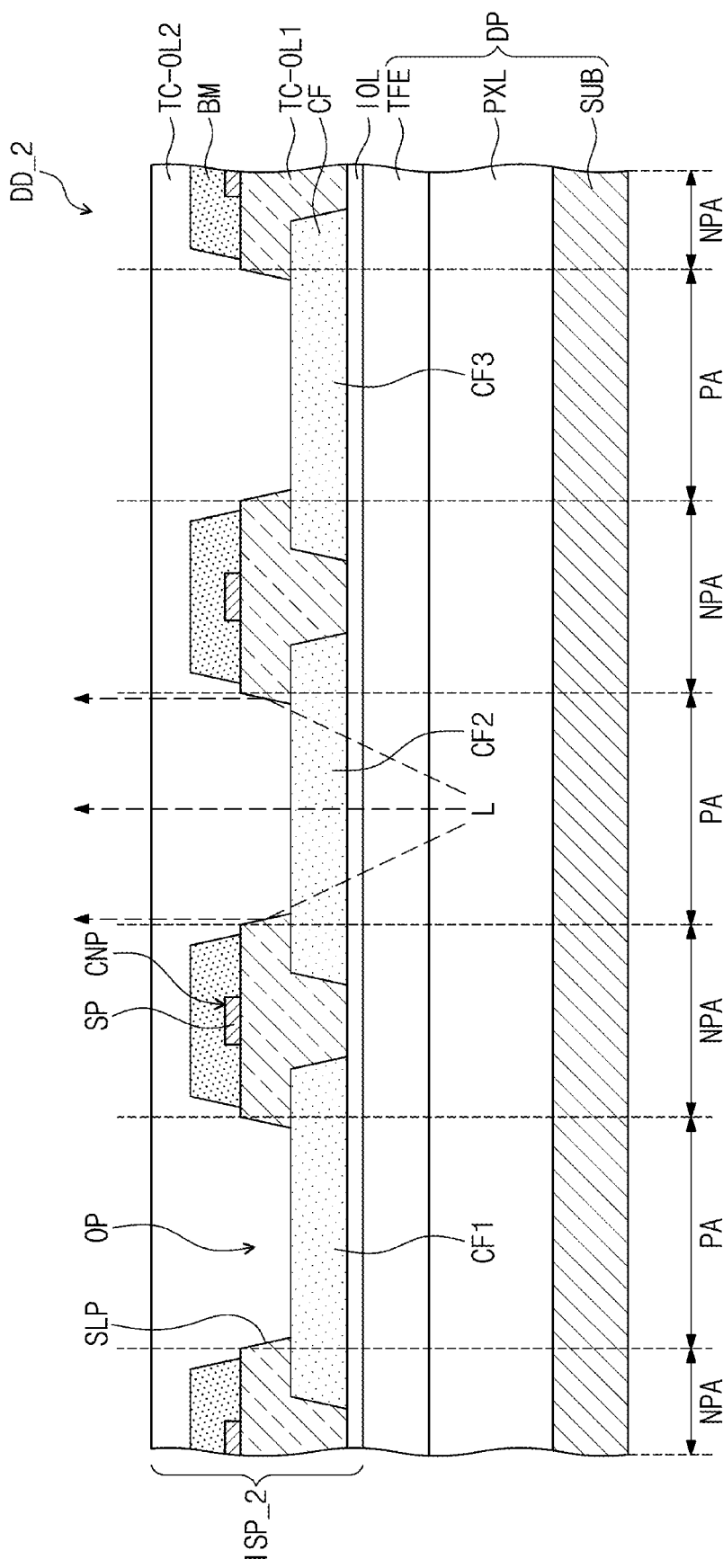
FIG. 17 is a diagram schematically illustrating a cross-sectional configuration of a display device including the input detection part illustrated in FIG. 15.

FIG. 17 is a diagram schematically illustrating a cross-sectional configuration of a display device including the input detection part illustrated in FIG. 15.

For example, in FIG. 17, cross-sections corresponding to FIG. 13 are illustrated as cross-sections of a display panel DP and an input detection part ISP_2.

Hereinafter, a configuration of the display device DD_2 illustrated in FIG. 17 will be described, mainly based on a configuration different from the configuration illustrated in FIG. 13, and the same configuration is illustrated using the same reference numerals.

Referring to FIG. 17, the conductive pattern CNP may overlap the non-light emitting area NPA and may be disposed on the first insulating layer TC-OL1. The black matrix BM may overlap the non-light emitting area NPA and may be disposed on the first insulating layer TC-OL1 and the conductive pattern CNP. Other configurations may be substantially the same as those illustrated in FIG. 13.

Figure 18:
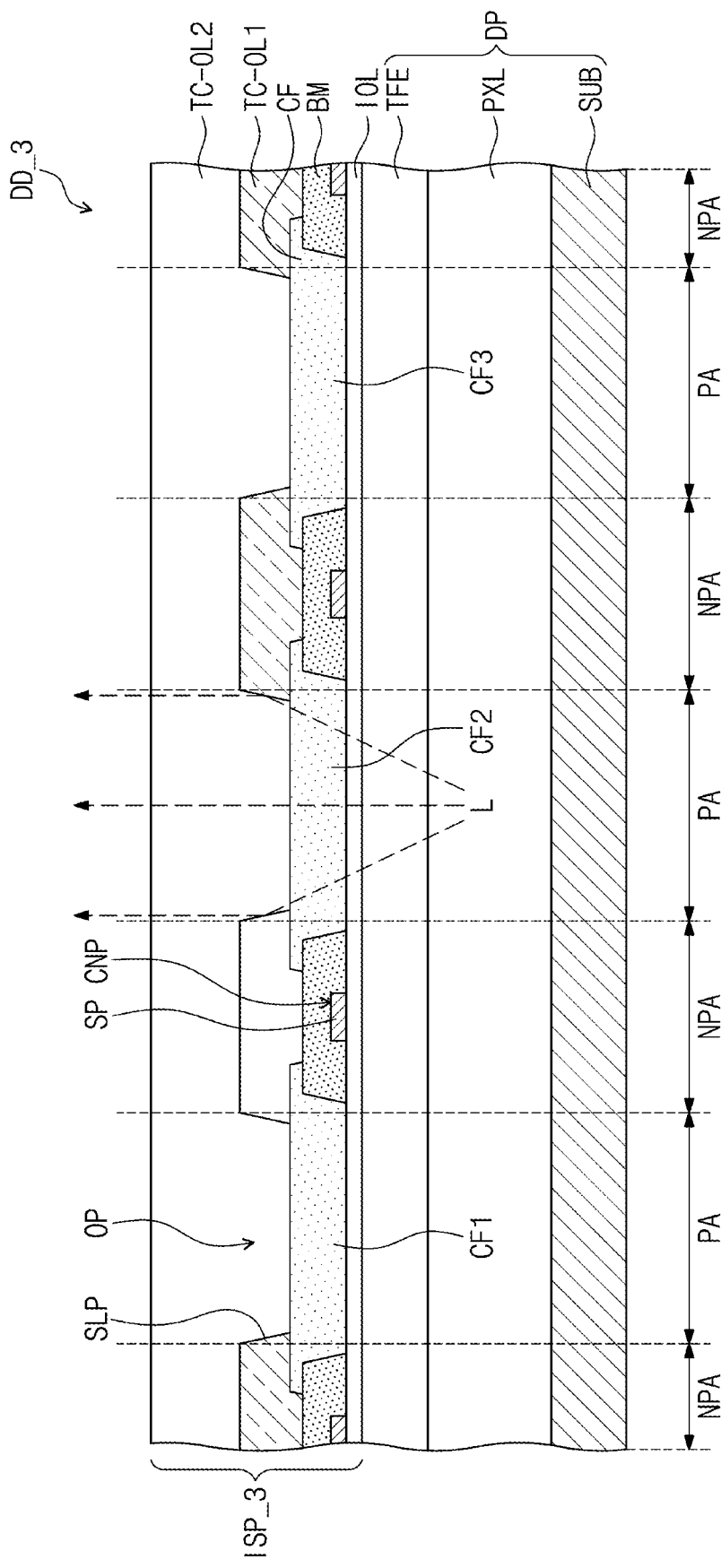
FIG. 18 is a view schematically illustrating a cross-sectional configuration of a display device according to another embodiment of the inventive concept.

FIG. 18 is a view schematically illustrating a cross-sectional configuration of a display device according to another embodiment of the inventive concept.

For example, in FIG. 18, cross-sections corresponding to FIG. 14 are illustrated as cross-sections of a display panel DP and an input detection part ISP_3.

Hereinafter, a configuration of the display device DD_3 illustrated in FIG. 18 will be described, mainly based on a configuration different from the configuration illustrated in FIG. 14, and the same configuration is illustrated using the same reference numerals.

Referring to FIG. 18, the conductive pattern CNP may overlap the non-light emitting area NPA, and may be disposed on the insulating layer IOL, and the black matrix BM may be disposed on the conductive pattern CNP. The black matrix BM may be disposed on the insulating layer IOL to cover the conductive pattern CNP. The first insulating layer TC-OL1 may be disposed on the black matrix BM. The conductive pattern CNP illustrated in FIG. 18 may be defined as a first conductive pattern. Other configurations may be substantially the same as those illustrated in FIG. 14.

Figure 19:
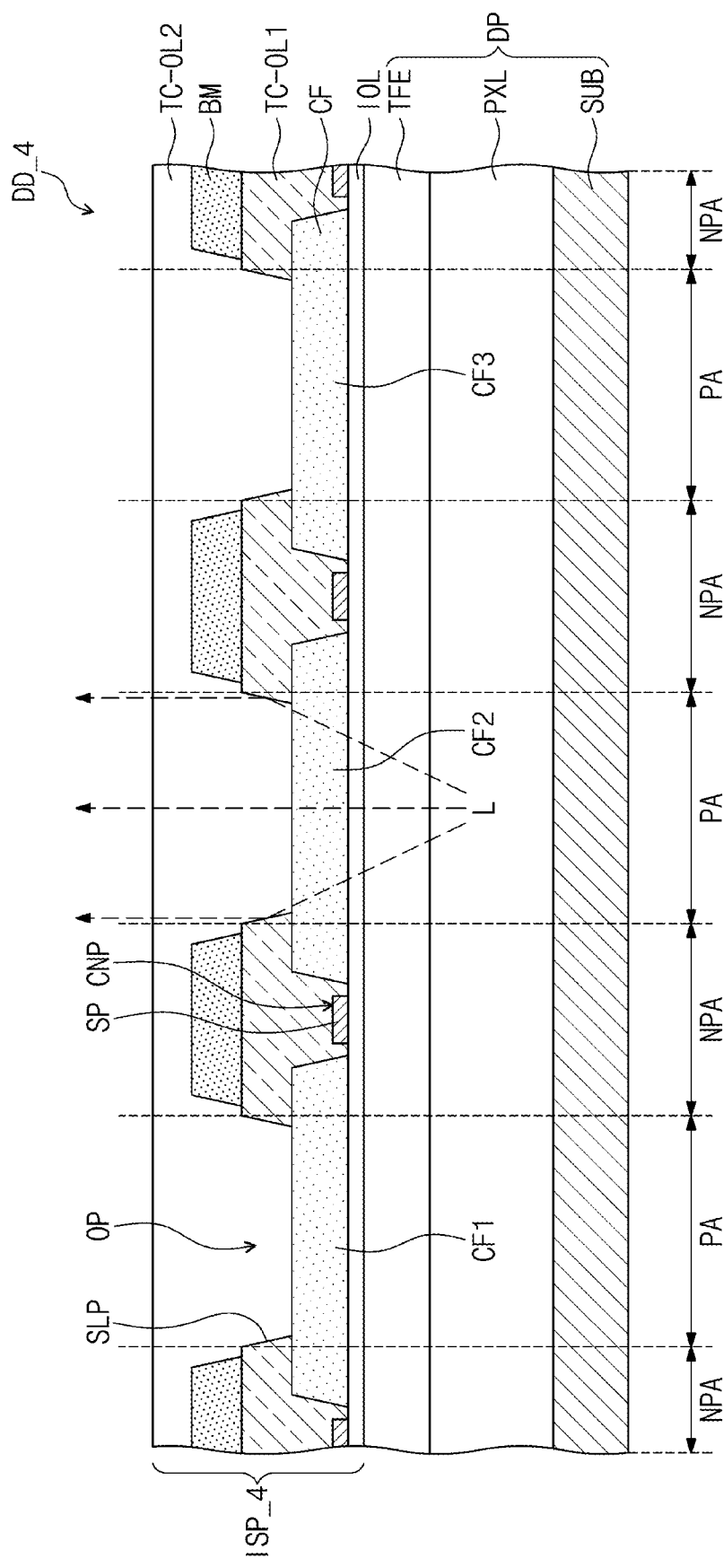
FIG. 19 is a view schematically illustrating a cross-sectional configuration of a display device according to another embodiment of the inventive concept.

FIG. 19 is a view schematically illustrating a cross-sectional configuration of a display device according to another embodiment of the inventive concept.

For example, in FIG. 19, cross-sections corresponding to FIG. 17 are illustrated as cross-sections of a display panel DP and an input detection part ISP_4.

Hereinafter, a configuration of the display device DD_4 illustrated in FIG. 19 will be described, mainly based on a configuration different from the configuration illustrated in FIG. 17, and the same configuration is illustrated using the same reference numerals.

Referring to FIG. 19, a conductive pattern CNP may overlap a non-light emitting area NPA and may be disposed on an insulating layer IOL, and a first insulating layer TC-OL1 may be disposed on a conductive pattern CNP. The first insulating layer TC-OL1 may be disposed on the insulating layer IOL to cover the conductive pattern CNP. The black matrix BM may overlap the non-light emitting area NPA and may be disposed on the first insulating layer TC-OL1. Other configurations may be substantially the same as those illustrated in FIG. 17.

According to an embodiment of the inventive concept, the detection parts sensing the external input, the color filters preventing reflection of external light, and the insulating layer having the reflective side to improve brightness are integrated in the input detection part, so that the thickness of the display device can be reduced.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A display device comprising:
   a display panel including a plurality of light emitting areas and a non-light emitting area between the light emitting areas;
   a first conductive pattern overlapping the non-light emitting area and disposed on the display panel;
   a first insulating layer disposed on the first conductive pattern and in which opening parts overlapping the light emitting areas are defined; and
   a second conductive pattern overlapping the non-light emitting area and disposed on the first insulating layer,
   wherein side surfaces of the first insulating layer where the opening parts are defined have an inclining surface.

2. The display device of claim 1, further comprising a color filter layer overlapping the light emitting areas and disposed on the display panel.

3. The display device of claim 2, wherein a width of the first insulating layer, which is defined as a distance between the opening parts, becomes smaller as it goes in an upper direction perpendicular to an upper surface of the display panel.

4. The display device of claim 2, wherein the color filter layer comprises:
   a first color filter; and
   a second color filter spaced apart from the first color filter,
   wherein each of the first and second color filters extends to a portion of the non-light emitting area adjacent to a corresponding light emitting area among the light emitting areas.

5. The display device of claim 2, wherein the color filter layer comprises a plurality of color filters,
   wherein the first conductive pattern is disposed between some of the color filters.

6. The display device of claim 1, further comprising a black matrix overlapping the non-light emitting area and disposed on the second conductive pattern and the first insulating layer.

7. The display device of claim 6, further comprising a second insulating layer disposed on a color filter layer, the first insulating layer, and the black matrix and configured to fill the opening parts.

8. The display device of claim 2, wherein a refractive index of the second insulating layer is greater than a refractive index of the first insulating layer.

9. The display device of claim 2, wherein the first insulating layer and the second insulating layer comprise an organic material.

10. The display device of claim 1, wherein the second conductive pattern comprises:
    a plurality of first detection parts having a mesh shape, arranged in a first direction, and connected to each other by the first conductive pattern;

a plurality of second detection parts having the mesh shape, arranged in a second direction intersecting the first direction, and alternately arranged with the first detection parts; and an extension pattern disposed between the second detection parts, and formed integrally with the second detection parts to extend from the second detection parts.

11. The display device of claim 10, wherein the first conductive pattern is connected to the first detection parts through contact holes defined in the first insulating layer.

12. The display device of claim 10, wherein the first conductive pattern comprises a first extension part and a second extension part,
wherein the extension pattern is disposed between the first extension part and the second extension part,
wherein the first extension part and the second extension part are connected to the first detection parts through an area overlapping the second detection parts.

13. The display device of claim 1, wherein the display panel further comprises:

a light emitting element disposed in each of the light emitting areas; and a thin film encapsulation layer disposed on the light emitting element.

14. The display device of claim 1, further comprising a black matrix overlapping the non-light emitting area and disposed on the first conductive pattern,
wherein the first insulating layer is disposed on the black matrix.

15. The display device of claim 14, wherein the first conductive pattern is connected to some patterns among the second conductive pattern through contact holes defined in the first insulating layer and the black matrix.

16. The display device of claim 14, further comprising a second insulating layer disposed on a color filter layer, the first insulating layer, and the second conductive pattern and configured to fill the opening parts.

* * * * *

UNITED STATES PATENT AND TRADEMARK OFFICE
CERTIFICATE OF CORRECTION

PATENT NO. : 12,039,117 B2
APPLICATION NO. : 18/134051
DATED : July 16, 2024
INVENTOR(S) : Ji-Hyun Kim et al.

Page 1 of 1

It is certified that error appears in the above-identified patent and that said Letters Patent is hereby corrected as shown below:

In the Claims

In Column 20, Line 57, in Claim 8, delete "claim 2," and insert -- claim 7, --.

In Column 20, Line 60, in Claim 9, delete "claim 2," and insert -- claim 7, --.

Signed and Sealed this
Third Day of December, 2024

Katherine Kelly Vidal
*Director of the United States Patent and Trademark Office*